US009704584B2

(12) United States Patent
Maejima et al.

(10) Patent No.: US 9,704,584 B2
(45) Date of Patent: Jul. 11, 2017

(54) SEMICONDUCTOR MEMORY DEVICE

(71) Applicant: KABUSHIKI KAISHA TOSHIBA, Tokyo (JP)

(72) Inventors: Hiroshi Maejima, Setagaya Tokyo (JP); Yuya Suzuki, Iwaki Fukushima (JP); Hidehiro Shiga, Yokohama Kanagawa (JP); Tomonori Kurosawa, Zama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/060,460

(22) Filed: Mar. 3, 2016

(65) Prior Publication Data
US 2016/0267992 A1 Sep. 15, 2016

(30) Foreign Application Priority Data

Mar. 12, 2015 (JP) ................. 2015-049680

(51) Int. Cl.
| | | |
|---|---|---|
| G11C 16/10 | (2006.01) | |
| G11C 16/04 | (2006.01) | |
| G11C 8/10 | (2006.01) | |
| G11C 8/12 | (2006.01) | |
| G11C 16/08 | (2006.01) | |

(52) U.S. Cl.
CPC ............. *G11C 16/10* (2013.01); *G11C 8/10* (2013.01); *G11C 8/12* (2013.01); *G11C 16/0483* (2013.01); *G11C 16/08* (2013.01)

(58) Field of Classification Search
CPC ..................................... G11C 16/10
USPC ................................... 365/185.28
See application file for complete search history.

(56) References Cited

U.S. PATENT DOCUMENTS

| | | | | |
|---|---|---|---|---|
| 7,672,169 B2* | 3/2010 | Ueno | ............... | G11C 16/0483 365/185.25 |
| 7,852,676 B2 | 12/2010 | Maejima | | |
| 7,859,902 B2 | 12/2010 | Maejima | | |
| 8,582,361 B2 | 11/2013 | Maejima | | |
| 8,599,614 B2* | 12/2013 | Miida | .................. | G11C 16/10 365/185.14 |
| 2009/0067242 A1* | 3/2009 | Jeon | .................... | G11C 16/10 365/185.11 |

(Continued)

FOREIGN PATENT DOCUMENTS

JP     2012-238363 A    12/2012

OTHER PUBLICATIONS

Taiwanese Office Action in related Taiwanese Patent Application 105107383 dated Dec. 21, 2016 with English Translation.

*Primary Examiner* — Son Mai
(74) *Attorney, Agent, or Firm* — Patterson & Sheridan, LLP

(57) ABSTRACT

A semiconductor memory device includes a first block including a first memory string that includes a first memory cell and a first select transistor, a second block including a second memory string that includes a second memory cell and a second select transistor, a source line that is connected to the first memory string and the second memory string, and a controller that applies a source line voltage to the source line and a first voltage to a gate of the second select transistor during a program operation in which data is written to the first memory cell, the first voltage being greater than ground voltage and less than or equal to the source line voltage.

20 Claims, 23 Drawing Sheets

(56) References Cited

U.S. PATENT DOCUMENTS

| | | | |
|---|---|---|---|
| 2009/0290420 A1* | 11/2009 | Park | G11C 16/3454 365/185.13 |
| 2015/0023102 A1* | 1/2015 | Maejima | G11C 16/10 365/185.11 |
| 2016/0055913 A1* | 2/2016 | Lee | G11C 16/10 365/185.24 |

* cited by examiner

SEMICONDUCTOR MEMORY DEVICE

CROSS-REFERENCE TO RELATED APPLICATION

This application is based upon and claims the benefit of priority from Japanese Patent Application No. 2015-049680, filed Mar. 12, 2015, the entire contents of which are incorporated herein by reference.

FIELD

Embodiments described herein relate generally to a semiconductor memory device.

BACKGROUND

A NAND flash memory in which memory cells are arranged in a three-dimensional manner is known in the art.

DETAILED DESCRIPTION

Figure 1:
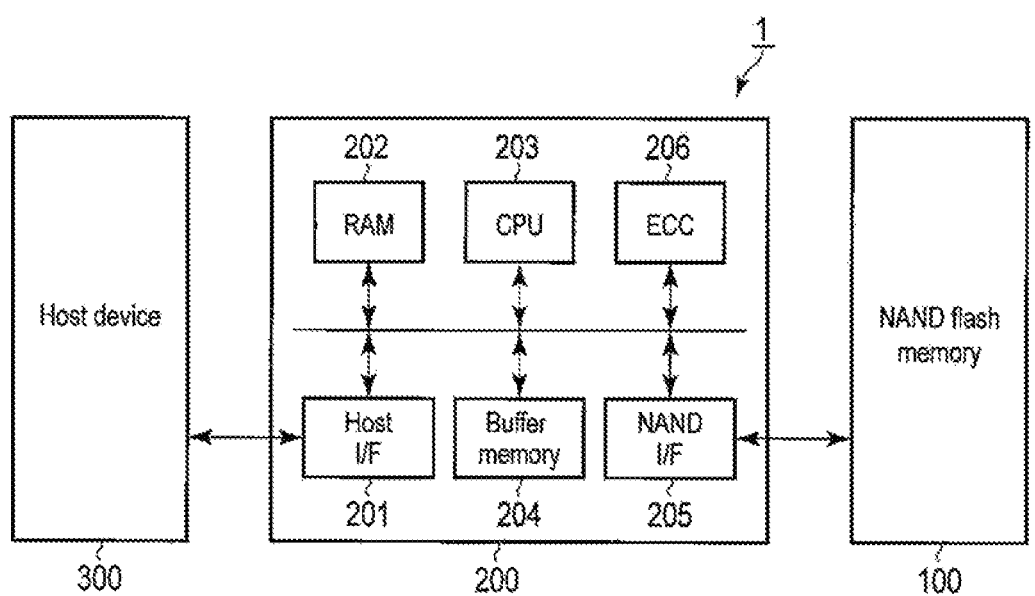
FIG. 1 is a diagram illustrating a configuration of a memory system including a semiconductor memory device according to a first embodiment.

Embodiments now will be described more fully hereinafter with reference to the accompanying drawings. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, such elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments are described herein with reference to cross section and perspective illustrations that are schematic illustrations of the embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

The embodiments provide a semiconductor memory device which can minimize current consumption.

In general, according to an exemplary embodiment, a semiconductor memory device includes a first block including a first memory string that includes a first memory cell and a first select transistor, a second block including a second memory string that includes a second memory cell and a second select transistor, a source line that is connected to the first memory string and the second memory string, and a controller that applies a source line voltage to the source line and a first voltage to a gate of the second select transistor during a program operation in which data is written to the first memory cell, the first voltage being greater than ground voltage and less than or equal to the source line voltage.

Hereinafter, embodiments will be described with reference to the drawings. In the description, the same reference numerals are given to the same portions depicted throughout all the drawings.

First Embodiment

A description will be made of a semiconductor memory device according to a first embodiment. Hereinafter, a three-dimensional stacked NAND flash memory in which memory cell transistors are stacked over a semiconductor substrate will be described as an example of the semiconductor memory device.

Configuration of Memory System

First, with reference to FIG. 1, a description will be made of a configuration of a memory system including the semiconductor memory device according to the present embodiment.

As illustrated in FIG. 1, a memory system 1 includes a NAND flash memory 100 and a memory controller 200. The memory controller 200 and the NAND flash memory 100 may form a single semiconductor device, for example, through a combination thereof, and, as an example thereof, there may be a memory card such as an SD™ card, or a solid state drive (SSD). The memory system 1 may further include a host device 300.

The NAND flash memory 100 includes a plurality of memory cell transistors, and stores data in a nonvolatile manner. Details of a configuration of the NAND flash memory 100 will be described later.

In response to commands from the host device 300, the memory controller 200 issues commands for reading, writing, erasing, or the like to the NAND flash memory 100.

The memory controller 200 includes a host interface circuit 201, an internal memory (RAM) 202, a processor (CPU) 203, a buffer memory 204, a NAND interface circuit 205, and an ECC circuit 206.

The host interface circuit 201 is connected to the host device 300 via a controller bus, and manages communication between the memory controller 200 and the host device 300. The host interface circuit 201 transmits a command and data which are received from the host device 300, to the CPU 203 and the buffer memory 204, respectively. The host interface circuit 201 transmits the data in the buffer memory 204 to the host device 300 in response to a command from the CPU 203.

The NAND interface circuit 205 is connected to the NAND flash memory 100 via a NAND bus. The NAND interface circuit 205 manages communication between the NAND flash memory 100 and the memory controller 200. The NAND interface circuit 205 transmits a command received from the CPU 203, to the NAND flash memory 100. The NAND interface circuit 205 transmits data to be written in the buffer memory 204 to the NAND flash memory 100 during writing of data. The NAND interface circuit 205 transmits data read from the NAND flash memory 100 to the buffer memory 204 during reading of data.

The CPU 203 controls the operation of the memory controller 200. For example, if a writing command is received from the host device 300, the CPU 203 issues a writing command based on the NAND interface circuit 205. This is also the same for reading and erasing. The CPU 203 performs various processes for managing the NAND flash memory 100, such as wear leveling. The CPU 203 performs various calculations. For example, a data encryption process or randomizing process is performed therein. As described above, also in a case where the host device 300 is included in the memory system 1, the CPU 203 controls an operation of the memory system 1.

The ECC circuit 206 performs data error checking and correcting (ECC) processes. In one example, the ECC circuit 206 generates parity based on data to be written during writing of data. The ECC circuit 206 generates syndrome from the parity during reading of data, so as to detect an error, and corrects the error. The CPU 203 may perform the function of the ECC circuit 206.

The internal memory 202 is a semiconductor memory such as RAM, and is used as a work area of the CPU 203. The internal memory 202 holds, for example, firmware or various management tables for managing the NAND flash memory 100.

Configuration of Semiconductor Memory Device

Next, with reference to FIG. 2, a configuration of the semiconductor memory device 100 will be described.

Figure 2:
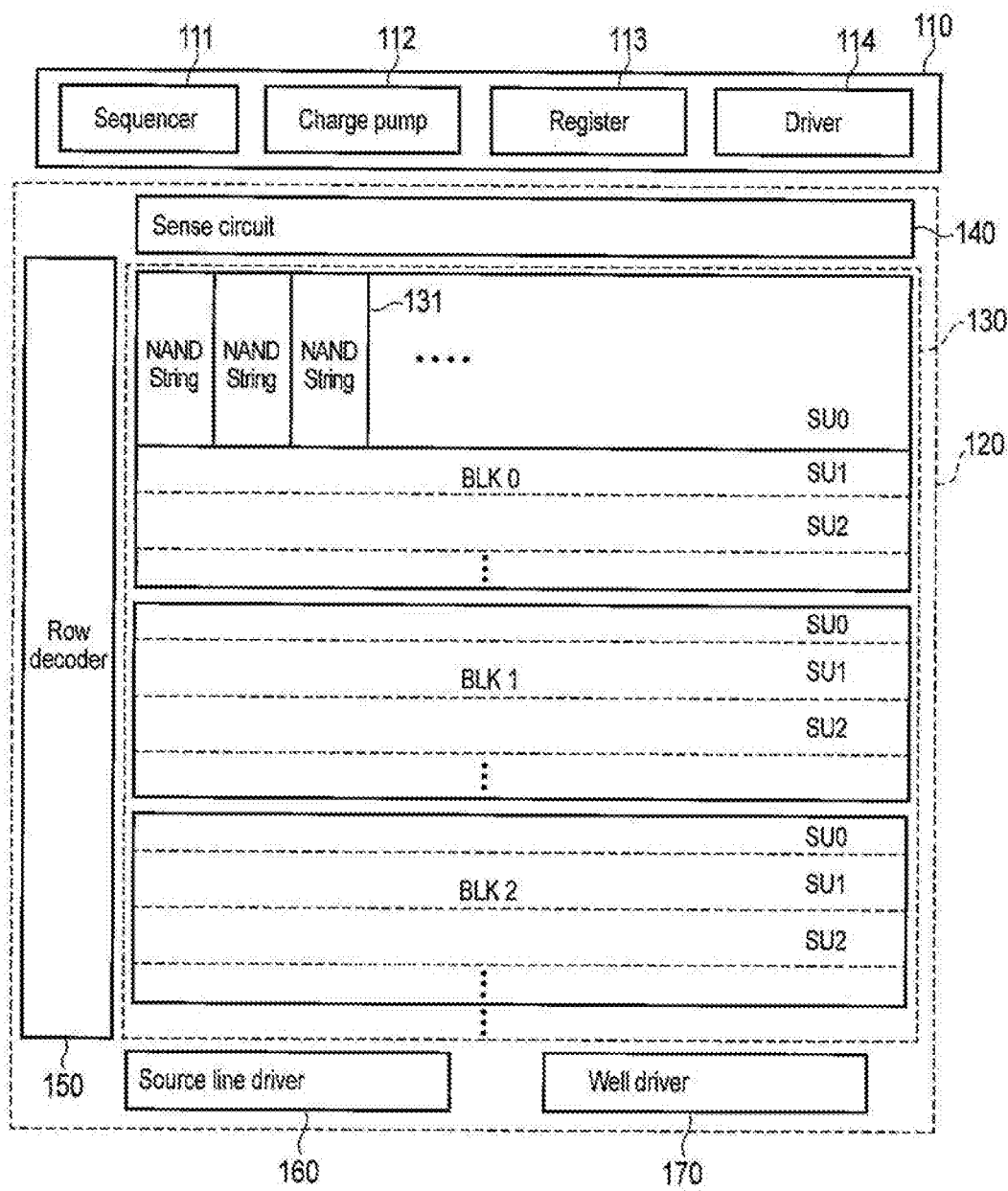
FIG. 2 is a block diagram illustrating a configuration of a NAND flash memory according to the first embodiment.

As illustrated in FIG. 2, the NAND flash memory 100 includes peripheral circuits 110 and a core section 120.

The core section 120 includes a memory cell array 130, a sense circuit 140, a row decoder 150, a source line driver 160, and a well driver 170.

The memory cell array 130 includes a plurality of nonvolatile memory cell transistors, and each of the plurality of nonvolatile memory cell transistors is associated with a word line and a bit line. The memory cell array 130 includes a plurality of (in the example of FIG. 2, three) blocks BLK (BLK0, BLK1, BLK2, . . . ) which are sets of the plurality of nonvolatile memory cell transistors. Each block BLK includes a plurality of string units SU (SU0, SU1, SU2, . . . ) which are sets of NAND strings 131 in which the memory cell transistors are connected in series to each other. Of course, the number of blocks in the memory cell array 130 or the number of string units in a single block BLK is arbitrary.

The row decoder 150 decodes a block address or a page address, so as to select anyone of word lines of a corresponding block. The row decoder 150 applies appropriate voltages to a selected word line and an unselected word line.

The sense circuit 140 includes a plurality of sense modules 141, and senses data which is read from a memory cell transistor to a bit line during reading of data. During writing of data, data to be written is transmitted to the memory cell transistor.

The source line driver 160 applies a voltage to a source line.

The well driver 170 applies a voltage to a well region where the NAND string 131 is formed.

The peripheral circuits 110 include a sequencer 111, a charge pump 112, a register 113, and a driver 114.

The sequencer 111 controls the operation of the NAND flash memory 100.

The driver 114 supplies voltages required to write, read, and erase data, to the row decoder 150, the sense circuit 140, the source line driver 160, and the well driver 170 under the control of the sequencer 111.

The charge pump 112 steps up a power supply voltage given from an external device, and supplies a stepped-up voltage to the driver 114.

The register 113 holds various signals. For example, the register 113 holds a status of a data writing or erasing operation, and thus notifies the controller whether or not the operation has successfully completed. The register 113 may also hold various tables.

Memory Cell Array

Next, with reference to FIG. 3, a configuration of the memory cell array 130 according to the first embodiment will be described in detail.

Figure 3:
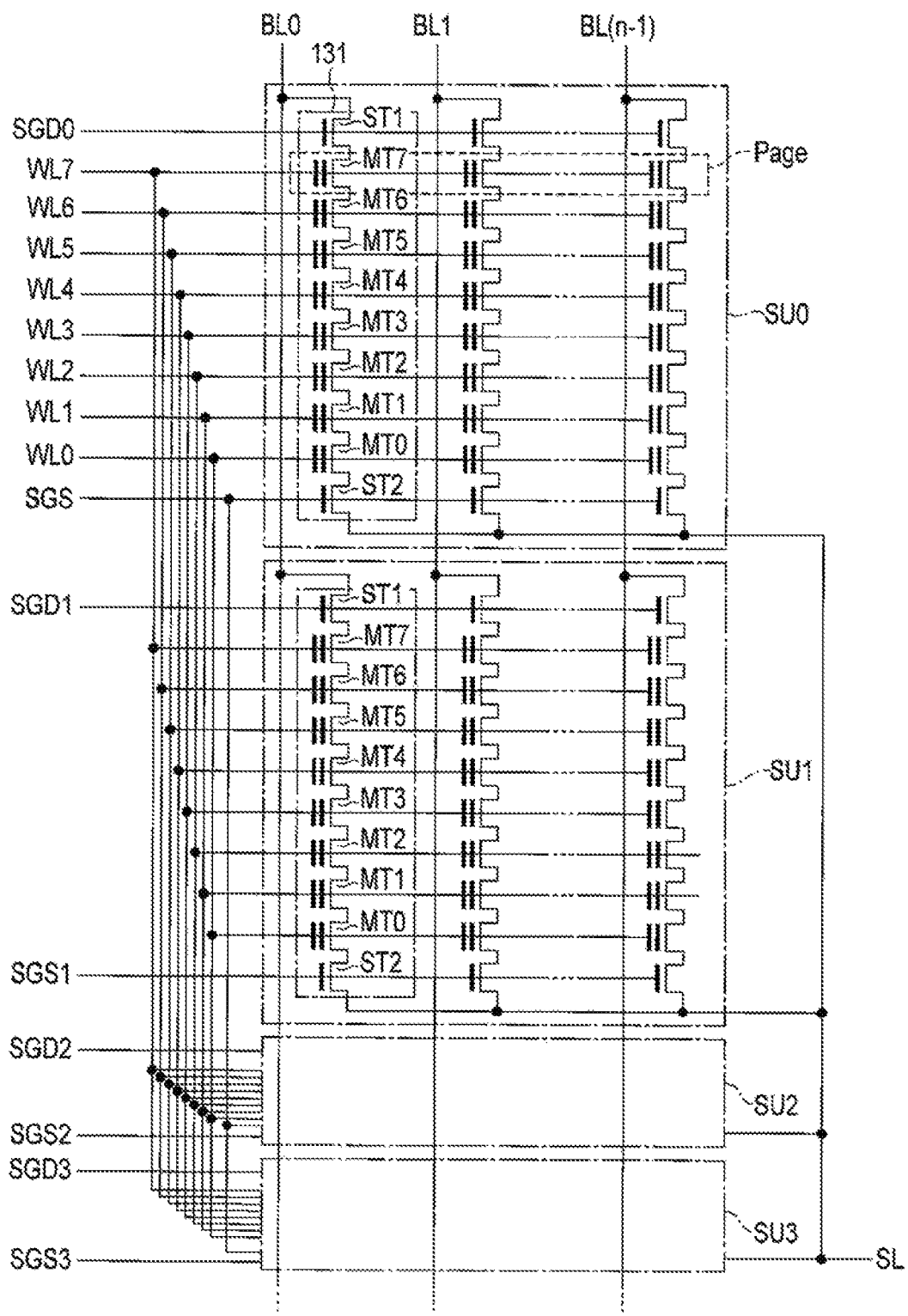
FIG. 3 is a circuit diagram illustrating a configuration of a memory cell array according to the first embodiment.

As illustrated in FIG. 3, each of the NAND strings 131 includes, for example, eight memory cell transistors MT (MT0 to MT7) and select transistors ST1 and ST2. Each of the memory cell transistors MT is provided with a stacked gate including a control gate and a charge storage layer, and stores data in a nonvolatile manner. The number of the memory cell transistors MT is not limited to 8, and may be 16, 32, 48, 64, 128, or the like, and the number thereof is not limited. When the memory cell transistors MT0 to MT7 are not differentiated from each other, the memory cell transistors are simply referred to as (a) memory cell transistor(s) MT.

The plurality of memory cell transistors MT are connected in series to each other between the select transistors ST1 and ST2.

Gates of the select transistors ST1 of the string units SU0 to SU3 are respectively connected to select gate lines SGD0 to SGD3, and gates of the select transistors ST2 are respectively connected to select gate lines SGS0 to SGS3. In contrast, control gates of the memory cell transistors MT0 to MT7 in the same block BLK0 (and in any string unit SU) are respectively connected to word lines WL0 to WL7. When the word lines WL0 to WL7 are not differentiated from each other, the word lines are simply referred to as (a) word line(s) WL.

In other words, although the word lines WL0 to WL7 are connected in common to the plurality of string units SU0 to SU3 in the same block BLK0, the select gate lines SGD and SGS are separately provided for the respective string units SU0 to SU3 even in the same block BLK0.

In the first embodiment, the block BLK0 includes, for example, four string units SU (SU0 to SU3). Other blocks BLK have the same configuration as the configuration of the block BLK0.

Among the NAND strings 131 arranged in a matrix configuration in the memory cell array 130, the other ends of the select transistors ST1 of the NAND strings 131 located in the same column are connected to one of bit lines BL (BL0 to BL (n−1), where (n−1) is a natural number of 1 or greater). The bit line BL is connected to the plurality of NAND strings 131 across a plurality of blocks BLK. The other ends of current paths of the select transistors ST2 are connected to a source line SL. The source line SL is connected to the NAND strings 131, for example, across a plurality of blocks.

As described above, data items of the memory cell transistors MT located in the same block BLK are collectively erased. In contrast, reading and writing of data are collectively performed on a plurality of memory cell transistors MT which are connected in common to any one of the word lines WL in any one of the string units SU of any one of blocks BLK. The above-described collective writing unit is referred to as a "page".

A data erasing method is not limited to a case where data is erased in units of a block, and another erasing method disclosed in, for example, U.S. patent application Ser. No. 13/235,389, filed on Sep. 18, 2011, entitled "Nonvolatile semiconductor memory device," may be employed. In addition, an erasing method disclosed in U.S. patent application Ser. No. 12/694,690, filed on Jan. 27, 2010, entitled "Nonvolatile semiconductor memory device," may be employed. The entire contents of these patent applications are incorporated by reference herein.

The embodiments may also employ a configuration of the memory cell array 130 disclosed in U.S. patent application Ser. No. 12/407,403, filed on Mar. 19, 2009, entitled "Three-dimensional stacked nonvolatile semiconductor memory," U.S. patent application Ser. No. 12/406,524, filed on Mar. 18, 2009, entitled "Three-dimensional stacked nonvolatile semiconductor memory," U.S. patent application Ser. No. 12/679,991, filed on Mar. 25, 2010, entitled "Nonvolatile semiconductor memory device and manufacturing method thereof," and U.S. patent application Ser. No. 12/532,030, filed on Mar. 23, 2009, entitled "Semiconductor memory and manufacturing method thereof." The entire contents of these patent applications are incorporated by reference herein.

Source Line Contact and Well Contact

Figure 4:
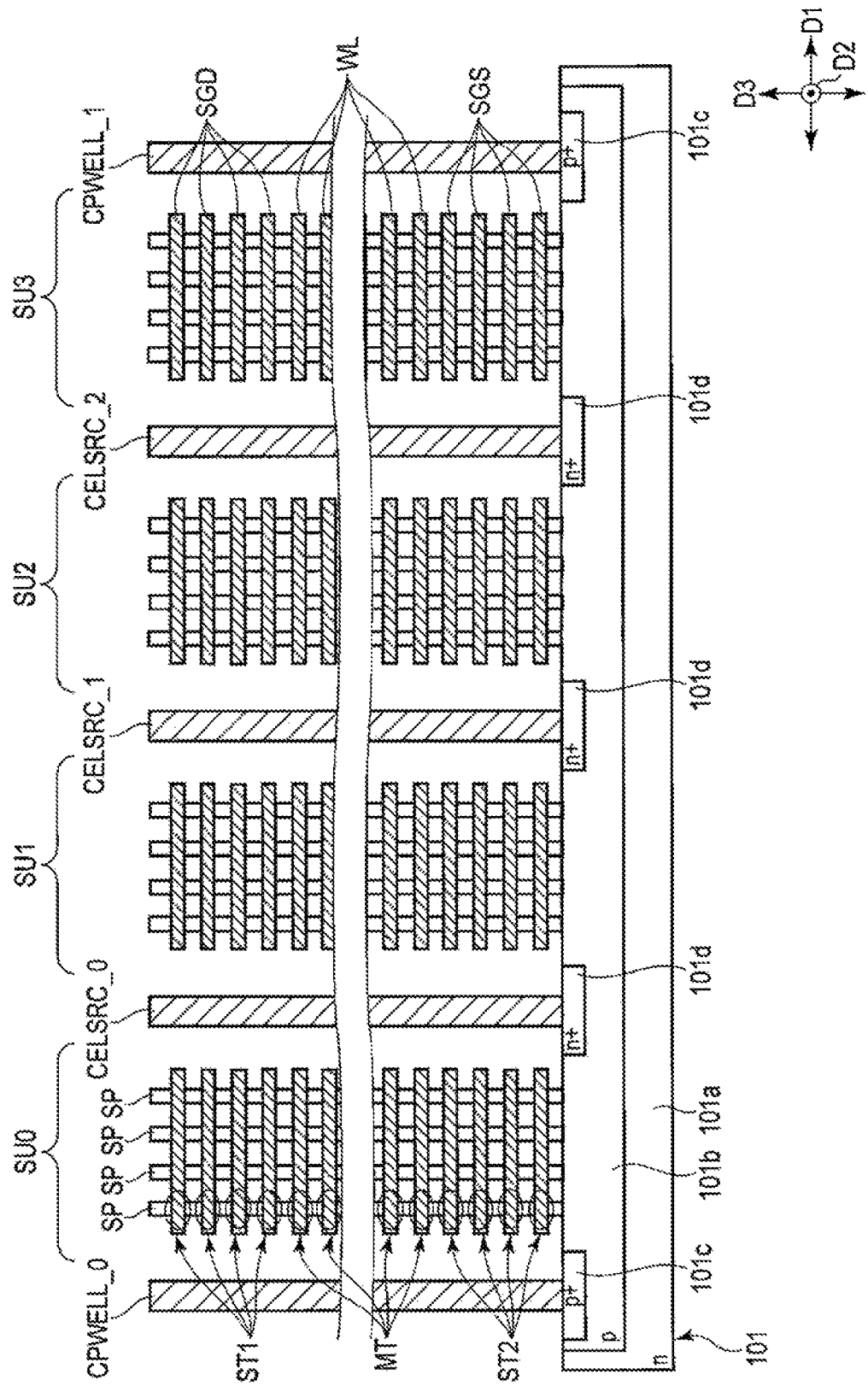
FIG. 4 is a sectional view illustrating a configuration of the memory cell array according to the first embodiment.

With reference to FIG. 4, a description will be made of a source line contact CELSRC and a well contact CPWELL included in the NAND flash memory 100 of the present embodiment.

As illustrated in FIG. 4, a semiconductor substrate 101 includes a p-type semiconductor substrate (not illustrated), an n-type semiconductor well 101a, a p-type well region 101b provided in a surface region of the semiconductor well 101a, a p-type diffusion region 101c provided in a surface region of the well region 101b, and an n-type diffusion region 101d provided in a surface region of the well region 101b.

As illustrated in FIG. 4, the memory cell array 130 includes a plurality of planar source line contacts CELSRC and a plurality of planar well contacts CPWELL. The well contact CPWELL connects the p-type diffusion region 101c to a wiring layer WRSub (not illustrated). The source line contact CELSRC connects an upper portion of the n-type well region 101d to a wiring layer WRsrc (not illustrated).

The string units SU0 to SU3 are arranged between the well contact CPWELL_0 and the well contact CPWELL_1. The source line contacts CELSRC_0 to CELSRC_2 are arranged between the respective string units SU.

When the source line contacts CELSRC_0 to CELSRC_2 are not differentiated from each other, the source line contacts are simply referred to as (a) source line contact(s) CELSRC. When the well contact CPWELL_0 and the well contact CPWELL_1 are not differentiated from each other, the well contacts are simply referred to as (a) well contact(s) CPWELL.

In the memory cell array 130, semiconductor pillars SP extend in the vertical direction (D3 direction) from the semiconductor substrate 101. The respective transistors MT, ST1 and ST2 are connected in series to each other in the D3 direction with the semiconductor pillar SP as a central axis. In other words, the respective transistors MT, ST1 and ST2 are provided in regions including the semiconductor pillars SP, and word lines WL and the select gate lines SGD and SGS which are provided in multiple layers.

Row Decoder

Next, with reference to FIG. 5, the row decoder 150 according to the present embodiment will be described. The row decoder 150 includes a driver 151 for each block BLK of the memory cell array 130.

The driver 151 includes an address decoder/level shifter 152, and nMOS transistors 151a, 151b, 151c, 151d and 151e.

The address decoder/level shifter 152 receives a signal BSTON from the sequencer 111, receives signals VRDEC_SEL and VRDEC_USEL from the driver 114, and receives a block address from an address circuit (not illustrated) of the peripheral circuits 110. The address decoder/level shifter 152 outputs a signal BLK_SEL based on the signal BSTON, the signal VRDEC_SEL, and the block address. The address decoder/level shifter 152 outputs a signal BLK_USEL based on the signal BSTON, the signal VRDEC_USEL, and the block address.

Figure 6:
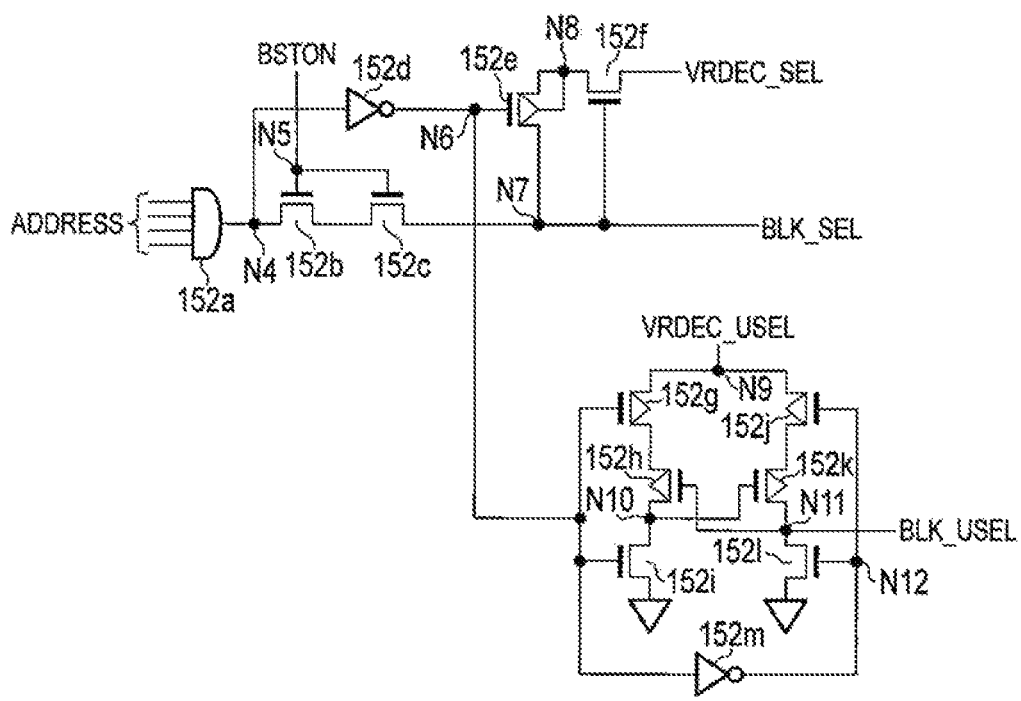
FIG. 6 is a circuit diagram illustrating a configuration of an address decoder/level shifter according to the first embodiment.

With reference to FIG. 6, a configuration of the address decoder/level shifter 152 will be described in detail. As illustrated in FIG. 6, the address decoder/level shifter 152 includes an address decoder 152a, nMOS transistors 152b, 152c, 152f, 152i and 152l, and pMOS transistors 152e, 152g, 152h, 152j and 152k, and inverters 152d and 152m.

The pMOS transistors 152e, 152g and 152j and the nMOS transistors 152i and 152l are turned on or off based on a decoding result in the address decoder 152a. The nMOS transistors 152b and 152c are turned on or off based on the signal BSTON. The nMOS transistor 152f is turned on or off based on a potential of a node N7. The pMOS transistor 152k is turned on or off based on a potential of a node N10. The pMOS transistor 152h is turned on or off based on a potential of a node N11. The signal VRDEC_SEL is supplied to a drain of the nMOS transistor 152f. The signal VRDEC_USEL is supplied to sources of the pMOS transistors 152g and 152j.

Details of Data Writing Operation According to First Embodiment

Figure 7:
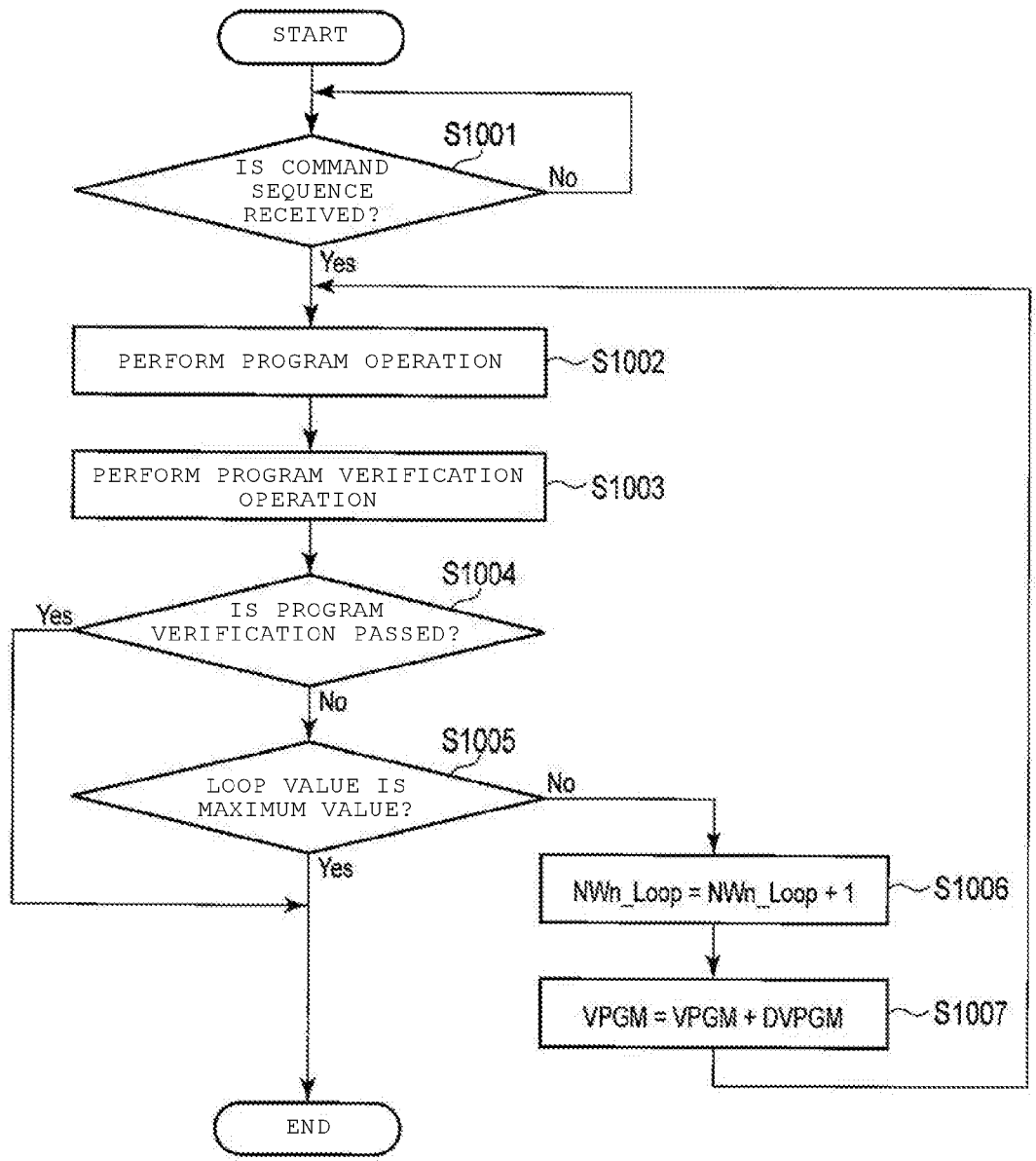
FIG. 7 is a flowchart illustrating a writing operation according to the first embodiment.

Next, with reference to a flowchart illustrated in FIG. 7, a description will be made of a data writing operation (including a program operation and a program verification operation) of the semiconductor memory device according to the present embodiment. The following processes are mainly performed under the control of the sequencer 111.

S1001

The sequencer 111 determines whether or not a program command, a block address, a page address, and a program starting command are received from the memory controller 200. Hereinafter, for simplification, the program command, the addresses, data, and the program starting command are collectively referred to as a "command sequence" in some cases.

S1002

When the command sequence is determined as being received (YES in step S1001), the sequencer 111 stores data of the received page in a cache (not illustrated) of the core section 120. The cache includes an SRAM or the like, and stores data supplied from the memory controller 200, a verification result detected by the sense circuit 140, and the like. Then, the sequencer 111 starts the program operation.

Hereinafter, the program operation will be described by dividing the program operation into an operation of the driver 151 related to a selected block and an operation of the driver 151 related to an unselected block.

Driver Related to Selected Block

First, an operation of the driver 151 related to a selected block in the program operation will be described.

Figure 8:
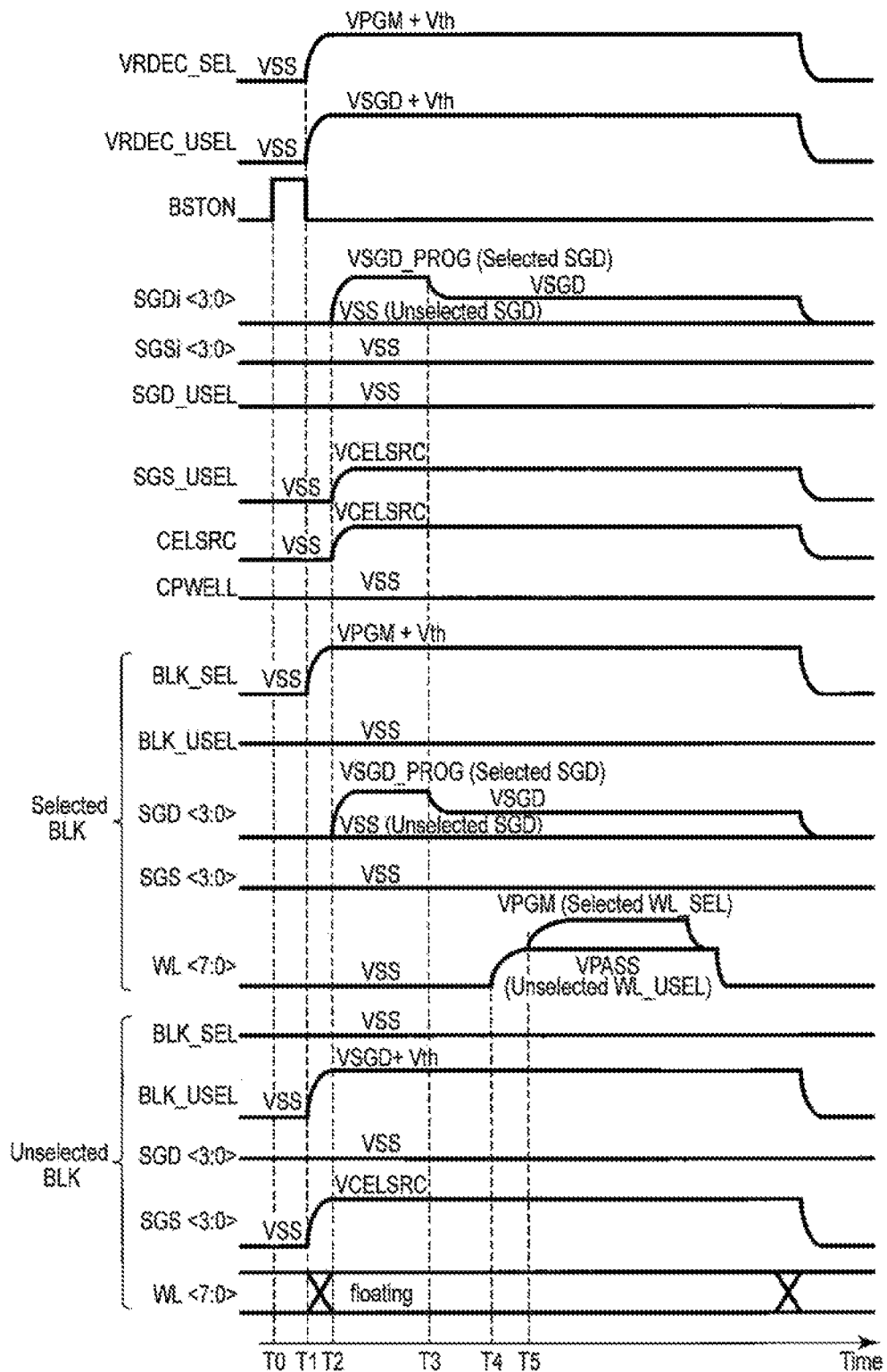
FIG. 8 is a waveform diagram illustrating a program operation according to the first embodiment.

As illustrated in FIG. 8, first, in response to a command from the sequencer 111, the driver 114 changes a level of the signal BSTON from a "low (L)" level to a "high (H)" level in a period from the time point T0 to the time point T1.

At the time point T0, the driver 114 sets voltages of the signal VRDEC_SEL and the signal VRDEC_USEL as "VSS" in response to a command from the sequencer 111. At the time point T0, the driver 114 sets voltages of the select gate lines SGDi, SGSi, and signals SGD_USEL and SGS_USEL as "VSS" in response to a command from the sequencer 111. At the time point T0, the source line driver 160 sets a voltage applied to the source line contact CELSRC as "VSS" in response to a command from the sequencer 111. At the time point T0, the well driver 170 sets a voltage applied to the well contact CPWELL as "VSS" in response to a command from the sequencer 111.

Next, with reference to FIG. 6 again, a description will be made of an operation of the address decoder/level shifter 152 related to a selected block at the time point T0. As illustrated in FIG. 6, in the address decoder/level shifter 152 related to a selected block, the address decoder 152a supplies a signal with an "H" level as a result of decoding the received block address, to a node N4. At the time point T0, a voltage of the signal BSTON is set as an "H" level, and thus transistors 152b and 152c are turned on. Thus, the decoding result in the address decoder 152a is output to the node N7 so that the transistor 152f is turned on. Since the node N4 has an "H" level, the inverter 152d outputs a signal with an "L" level to a node N6. As a result, the transistor 152g is turned on, and the transistor 152i is turned off. Since the node N6 has an "L" level, the inverter 152m supplies a signal with an "H" level to a node N12. For this reason, the transistor 152j is turned off, and the transistor 152l is turned on. Thus, a node N11 is connected to the ground and thus has an "L" level. As a result, the transistor 152h is turned on.

Next, with reference to FIG. 8, a description will be made of an operation of the sequencer 111 at the time point T1. As illustrated in FIG. 8, at the time point T1, in response to a command from the sequencer 111, the driver 114 sets the signal VRDEC_SEL as "VPGM+Vth" (VSS<VPGM). In response to a command from the sequencer 111, the driver 114 sets the signal VRDEC_USEL as "VSGD+Vth" (VSS<VSGD<VPGM).

Next, referring to FIG. 6 again, a description will be made of an operation of the address decoder/level shifter 152 related to a selected block at the time point T1. As illustrated in FIG. 6, in the address decoder/level shifter 152 related to the selected block BLK, the node N7 is set as an "H" level in a period between the time point T0 and the time point T1, and thus the transistor 152f is turned on in the period. For this reason, the voltage "VPGM+Vth" is applied to a node N8 via a source and a drain of the transistor 152f. Since the transistor 152e is in an ON state in the period between the time point T0 and the time point T1, the voltage "VPGM+Vth" is applied to the node N7 via a source and a drain of the transistor 152e.

At the time point T1, a voltage of the signal BSTON is set to an "L" level, and thus transistors 152b and 152c are turned off. However, the voltage "VPGM+Vth" is applied from the transistor 152e. As a result, the transistor 152f is maintained in an ON state even after a voltage of the signal BSTON is set to an "L" level. Consequently, a voltage of the signal BLK_SEL becomes "VPGM+Vth" ("H" level). At the time point T1, since the node N11 is maintained to have an "L" level, a voltage of the signal BLK_USEL becomes "VSS" ("L" level)

Figure 5:
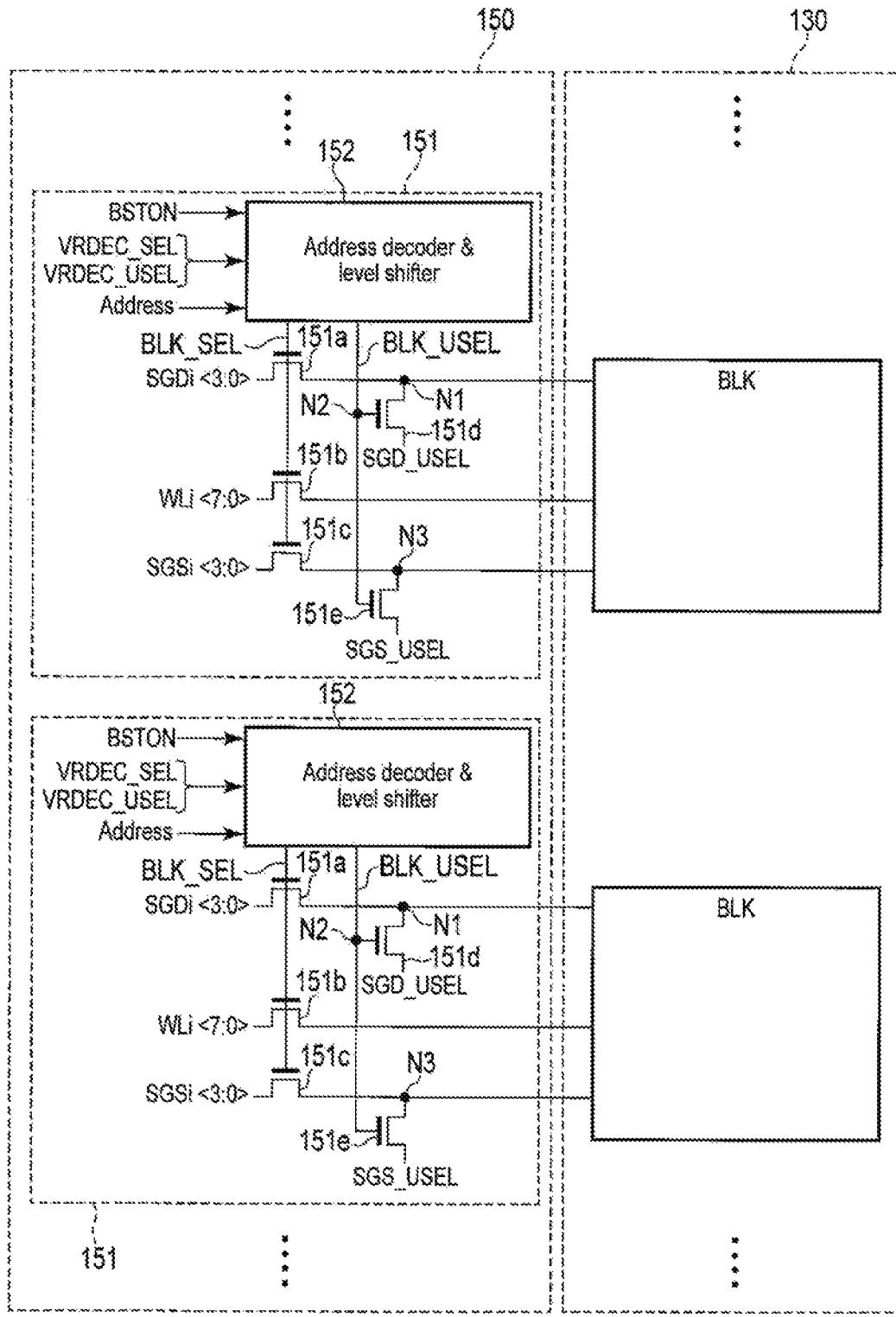
FIG. 5 is a block diagram illustrating a configuration of a row decoder according to the first embodiment.

In other words, the transistors 151a, 151b and 151c are turned on, and the transistors 151d and 151e are turned off (refer to FIG. 5).

Therefore, the select gate line SGDi<3:0> is electrically connected to the select gate line SGD<3:0> of the selected block BLK of the memory cell array 130. The select gate line SGSi<3:0> is electrically connected to the select gate line SGS<3:0> of the selected block BLK of the memory cell array 130. The signal line WLi<7:0> is electrically connected to the word line WL<7:0> of the selected block BLK of the memory cell array 130.

Next, with reference to FIG. 8 again, an operation of the sequencer 111 at the time point T2 will be described. As illustrated in FIG. 8, the sequencer 111 precharges the bit line in a period between the time point T2 to the time point T4. More specifically, at the time point T2, in response to a command from the sequencer 111, the driver 114 sets a voltage of the selected select gate line SGDi (selected SGD) which is selected as "VSGD_PROG" (VSS<VSGD<VSGD_PROG<VPGM), and sets the select gate line SGSi and the unselected select gate line SGDi (unselected SGD) as "VSS". At the time point T2, in response to a command from the sequencer 111, the source line driver 160 sets a voltage applied to the source line contact CELSRC as "VCELSRC" (VSS<VCELSRC<VSGD<VSGD_PROG<VPGM).

At the time point T3, in response to a command from the sequencer 111, the driver 114 sets a voltage applied to the select gate line SGD (selected SGD) as "VSGD".

Next, at the time point T4, in response to a command from the sequencer 111, the driver 114 sets a voltage applied to the selected word line WL_SEL and the unselected word line WL_USEL in the selected block BLK as "VPASS" (VSS<VCELSRC<VSGD<VSGD_PROG<VPASS<VPGM). At the time point T5, in response to a command from the sequencer 111, the driver 114 sets a voltage applied to the selected word line WL_SEL in the selected block BLK as "VPGM".

Consequently, the program operation is performed on a selected memory cell. The data stored in the cache (not illustrated) is programmed into the memory cell array 130.

Driver Related to Unselected Block

Next, an operation of the driver 151 related to an unselected block during the program operation will be described.

With reference to FIG. 6, a description will be made of an operation of the address decoder/level shifter 152 related to an unselected block at the time point T0. As illustrated in FIG. 6, in the address decoder/level shifter 152 related to the unselected block, the address decoder 152a supplies a signal with an "L" level to the node N4. Since a voltage of the signal BSTON is set to an "H" level, the transistors 152b and 152c supply a signal with an "L" level to the node N7. Since the node N4 has an "L" level, the inverter 152d outputs a signal with an "H" level to the node N6. The transistor 152i is turned on, and thus the node N10 is connected to the ground. Since the node N6 has an "H" level, the inverter 152m supplies a signal with an "L" level to the node N12.

As illustrated in FIG. 6, in the address decoder/level shifter 152 related to the unselected block BLK, the signal VRDEC_USEL is supplied to the node N11 via the transistors 152j and 152k (time point T1). For this reason, a voltage of the node N11 becomes "VSGD+Vth". Consequently, the signal BLK_USEL is set to "VSGD+Vth" ("H" level).

Thus, the transistors 151a, 151b and 151c related to the unselected block BLK are turned off, and the transistors 151d and 151e are turned on (refer to FIG. 5).

Therefore, the signal line SGD_USEL is electrically connected to the select gate line SGD<3:0> of the unselected block BLK of the memory cell array 130. The signal line SGS_USEL is electrically connected to the select gate line SGS<3:0> of the unselected block BLK of the memory cell array 130. The word line WL of the unselected block BLK of the memory cell array 130 is not connected to the signal line WLi and thus enters a floating state.

As described above, a node N1 and a node N3 of the unselected block BLK are connected to a driver (not illustrated) which generates a signal SGS_USEL. The driver is included in the driver 114. As illustrated in FIG. 8, at the time point T2, in response to a command from the sequencer 111, the driver generating the signal SGS_USEL generates a voltage "VCELSRC" as the signal SGS_USEL. In response to a command from the sequencer 111, the driver 114 sets a voltage of the signal SGD_USEL as "VSS". At the time point T2, in response to a command from the sequencer 111, the source line driver 160 sets a voltage applied to the source line contact CELSRC as "VCELSRC".

Next, at the time point T4, in response to a command from the sequencer 111, the driver 114 sets a voltage of the signal line WLi as "VPASS". The signal line WLi is connected to the word line WL of the selected block, and thus the voltage "VPASS" is transmitted. The signal line WLi is disconnected from the word line WL of the unselected block and enters a floating state.

Figure 9:
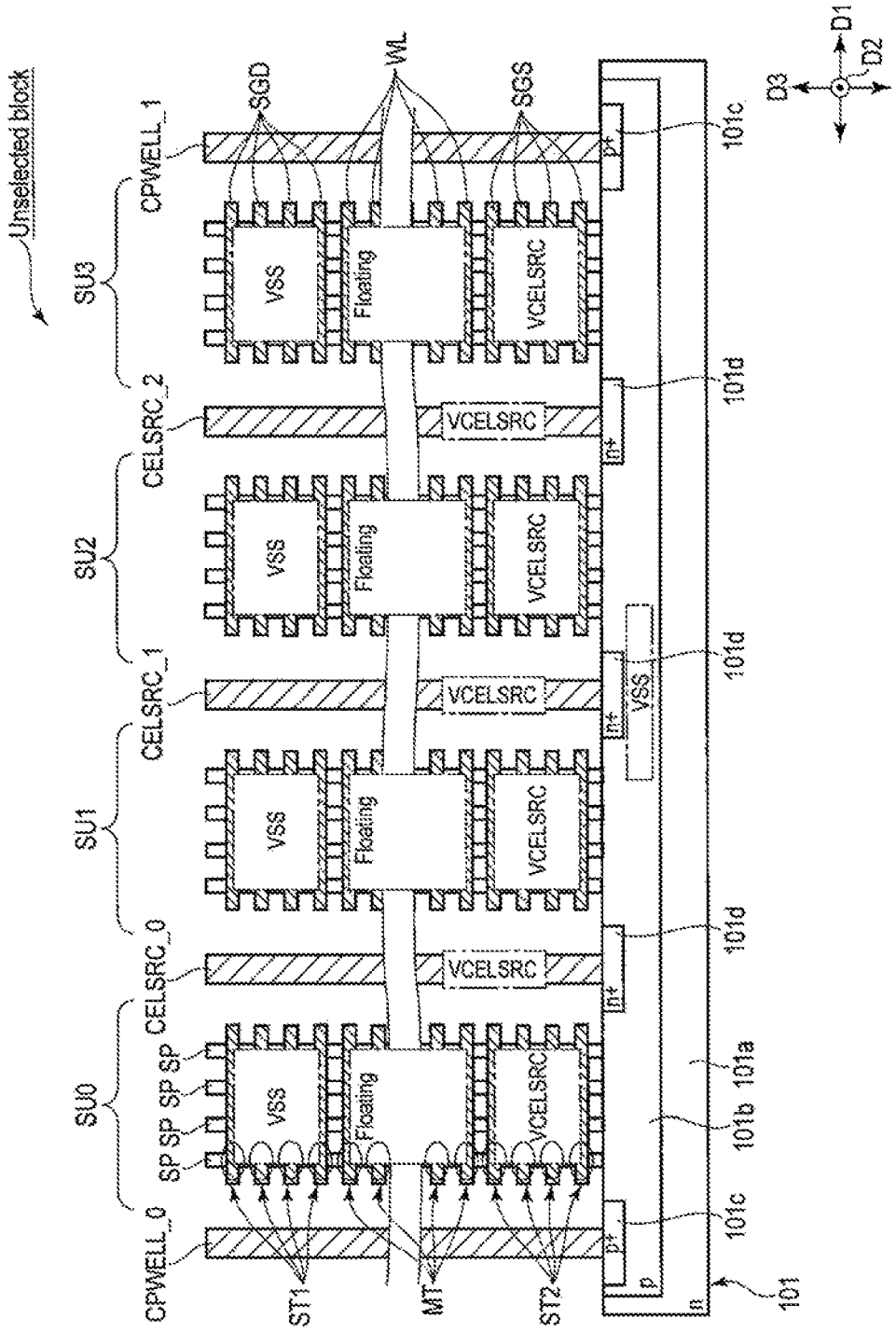
FIG. 9 is a sectional view illustrating a configuration of the memory cell array according to the first embodiment.

As mentioned above, in the present embodiment, during the data program operation in the selected block, as illustrated in FIG. 9, the voltage "VCELSRC" which is the same as the voltage applied to the source line contact CELSRC is applied to the gate electrode SGS of the select transistor ST2 in the unselected block.

S1003

Next, in response to a command from the sequencer 111, the row decoder 150 applies a program verification voltage Vpvf to a word line WLn_SEL which is appropriately selected, so as to perform a program verification operation.

S1004

The sequencer 111 determines whether or not the program verification is successful. When the program verification is successful in a selected page (YES in step S1004), the writing operation on the corresponding page is finished.

S1005

When the program verification on the selected page is determined as being unsuccessful (NO in step S1004), the sequencer 111 determines whether or not the number of loops NWLn_loop of the program operation on the corresponding page reaches the maximum value. When the number of loops NWLn_loop is determined as reaching the maximum value (YES in step S1005), the sequencer 111 finishes the writing operation on the page.

S1006

When the sequencer 111 determines that the number of loops NWLn_loop has not reached the maximum value in step S1005 (NO in step S1005), the sequencer 111 updates the number of loops NWLn_loop to NWLn_loop+1.

S1007

The sequencer 111 increases the program voltage VPGM by DVPGM. The sequencer 111 repeatedly performs the operation in step S1002 with using the updated program voltage VPGM.

The sequencer 111 repeatedly performs the operations in steps S1002 to S1007 until the sequencer determines that the verification operation in step S1004 is successful, or the number of loops NWLn_loop reaches the maximum value in step S1005.

Operations and Effects According to First Embodiment

According to the above-described embodiment, in the program operation, the sequencer 111 applies a voltage which is the same as a voltage applied to the source line contact, to the gate electrode of the select transistor related to the unselected block of the memory cell array 130. This is illustrated in FIG. 9.

Figure 10:
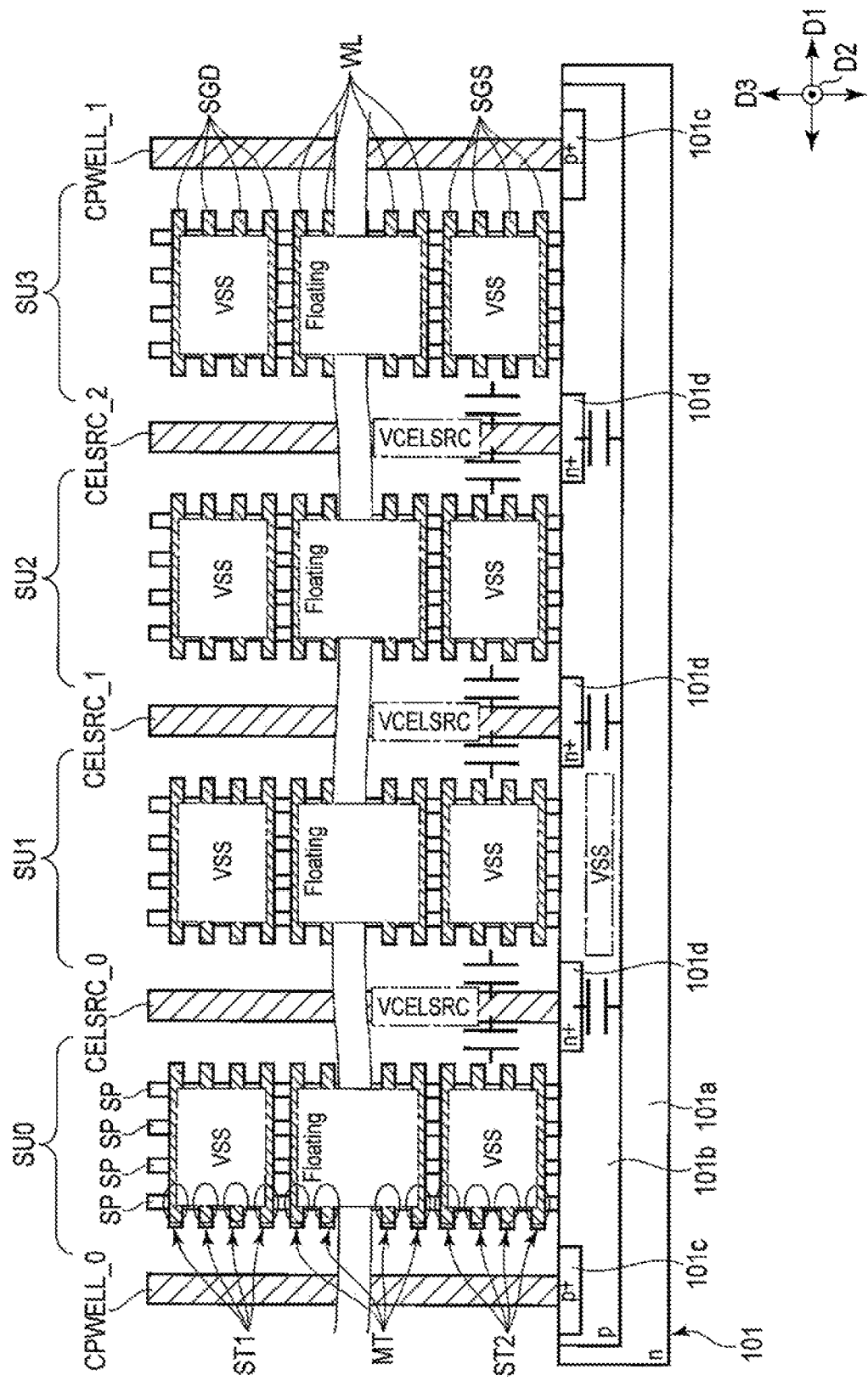
FIG. 10 is a sectional view illustrating a configuration of a memory cell array according to a comparative example.

Meanwhile, as illustrated in FIG. 10, in the program operation, the sequencer 111 may set a voltage applied to the select gate line SGS (unselected block) of the unselected block to "VSS". In this case, as illustrated in FIG. 10, a parasitic capacitance occurs between the source line contact CELSRC and the select transistor ST2. For this reason, during the program operation, current consumption required to charge the source line contact CELSRC may increase.

However, during the program operation according to the present embodiment, the sequencer 111 applies the voltage "VCELSRC" which is applied to the source line contact CELSRC, to the gate electrode SGS of the select transistor ST2 of the unselected block. For this reason, when compared with a program operation of the comparative example as illustrated in FIG. 10, in the program operation according to the present embodiment, a parasitic capacitance can be prevented from occurring between the source line contact CELSRC and the select transistor ST2. Consequently, during the program operation, current consumption required to charge the source line contact CELSRC can be minimized.

In the above-described first embodiment, during the program operation, the sequencer 111 applies the voltage "VSS" to the gate electrode SGD of the select transistor ST1 of the unselected block, but the first embodiment is not limited thereto. For example, the sequencer 111 may apply a voltage between the voltage "VSS" and the voltage "VCELSRC" to the gate electrode SGD of the select transistor ST1 of the unselected block.

In the above-described first embodiment, the sequencer 111 applies the voltage "VCELSRC" to the gate electrode SGS of the select transistor ST2 of the unselected block, but the first embodiment is not limited thereto. For example, the sequencer 111 may apply a voltage between the voltage "VSS" and the voltage "VCELSRC" to the gate electrode SGS of the select transistor ST2 of the unselected block. Also in this case, when compared with the program operation of the comparative example, in the program operation according to the present embodiment, current consumption required to charge the source line contact CELSRC can be minimized.

In the first embodiment, during the program operation, the sequencer 111 applies the voltage "VCELSRC" to the gate electrode SGS of the select transistor ST2 of the unselected block, and applies the voltage "VSS" to the gate electrode SGD of the select transistor ST1 of the unselected block, but the first embodiment is not limited thereto. For example, during the program operation, the sequencer 111 may apply the voltage "VSS" to the gate electrode SGS of the select transistor ST2 of the unselected block, and may apply the voltage "VCELSRC" to the gate electrode SGD of the select transistor ST1 of the unselected block.

Also, the sequencer 111 may apply a voltage between the voltage "VSS" and the voltage "VCELSRC" to the gate electrode SGS of the select transistor ST2 of the unselected block.

In addition, the sequencer 111 may apply a voltage between the voltage "VSS" and the voltage "VCELSRC" to the gate electrode SGD of the select transistor ST1 of the unselected block.

Modification Example 1

Next, Modification Example 1 will be described. The basic configuration and operation of a memory device according to Modification Example 1 are the same as those of the memory device according to the first embodiment. Therefore, description of the content described in the first embodiment and content which can be easily analogized from the first embodiment will be omitted.

Details of Data Writing Operation According to Modification Example 1

Next, with reference to the flowchart of FIG. 7, a description will be made of a data writing operation of a semiconductor memory device according to Modification Example 1. The writing operation is the same as the operation described in the first embodiment except for step S1002.

S1001

The NAND flash memory 100 performs the same operation as the operation described in the first embodiment.

S1002

When the command sequence is determined as being received (YES in step S1001), the sequencer 111 stores data of the received page in a cache (not illustrated).

Then, the sequencer 111 starts the program operation.

Hereinafter, with reference to FIG. 11, an operation of the driver 151 related to an unselected block in the program operation will be described. An operation of the driver 151 related to a selected block is the same as the operation described in step S1002 according to the first embodiment.

Driver Related to Unselected Block

An operation of the driver 151 related to an unselected block in the program operation will be described. Operations of the sequencer 111 at the time point T0 and the time point T1 are the same as the operations of the sequencer 111 at the time point T0 and the time point T1, described in the first embodiment.

Figure 11:
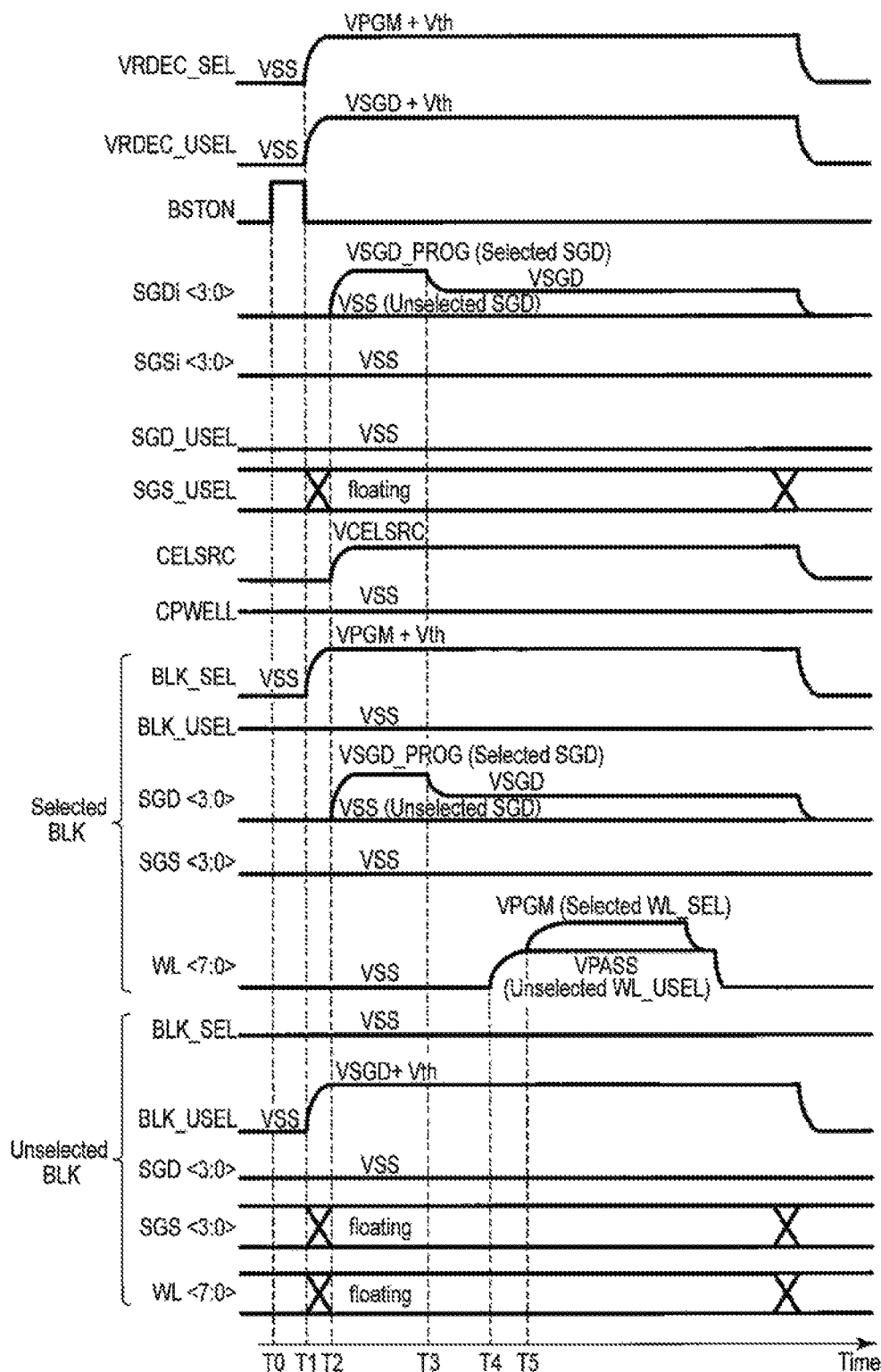
FIG. 11 is a waveform diagram illustrating a program operation according to a first modification example of the first embodiment.

As illustrated in FIG. 11, at the time point T2, in response to a command from the sequencer 111, the driver 114 sets a voltage applied to the select gate line SGD (unselected block) as "VSS". At the time point T2, in response to a command from the sequencer 111, the source line driver 160 sets a voltage applied to the source line contact CELSRC as "VCELSRC". At the time point T2, the sequencer 111 causes the signal line SGS_USEL to enter a floating state. Consequently, the select gate line SGS<3:0> of the unselected block, connected to the signal line SGS_USEL, enters a floating state.

Operations of the sequencer 111 in a period between the time point T3 and the time point T5 are the same as the operations of the NAND flash memory 100 in the period between the time point T3 and the time point T5, described in the first embodiment.

When the select gate line SGS is in a floating state, a parasitic capacitance between the source line contact CELSRC and the select transistor ST2 can be reduced. As a result, a similar effect as the effect described in the first embodiment can be achieved.

S1003 to S1007

The NAND flash memory 100 performs the same operations as the operations described in the first embodiment.

The sequencer 111 repeatedly performs the operations in steps S1002 to S1007 until the sequencer determines that the verification operation in step S1004 is successful, or the number of loops NWLn_loop reaches the maximum value in step S1005.

In the Modification Example 1, during the program operation, although the sequencer 111 applies the voltage "VSS" to the gate electrode SGD of the select transistor ST1 of the unselected block, Modification Example 1 is not limited thereto. For example, the sequencer 111 may apply a voltage between the voltage "VSS" and the voltage "VCELSRC" to the gate electrode SGD of the select transistor ST1 of the unselected block.

In the Modification Example 1, during the program operation, the sequencer 111 causes the gate electrode SGS of the select transistor ST2 of the unselected block to enter a floating state, and applies the voltage "VSS" to the gate electrode SGD of the select transistor ST1 of the unselected block, but Modification Example 1 is not limited thereto. For example, during the program operation, the sequencer 111 may apply the voltage "VSS" to the gate electrode SGS of the select transistor ST2 of the unselected block, and may cause the gate electrode SGD of the select transistor ST1 of the unselected block to enter a floating state. In this case, the sequencer 111 may apply a voltage between the voltage "VSS" and the voltage "VCELSRC" to the gate electrode SGS of the select transistor ST2 of the unselected block.

Modification Example 2

Next, Modification Example 2 will be described. The basic configuration and operation of a memory device according to Modification Example 2 are the same as those of the memory device according to the first embodiment. Therefore, description of the content described in the first embodiment and content which can be easily analogized from the first embodiment will be omitted.

Details of Data Writing Operation According to Modification Example 2

Next, with reference to the flowchart of FIG. 7, a data writing operation of a semiconductor memory device according to Modification Example 2 will be described. The writing operation is the same as the operation described in the first embodiment except for step S1002.

S1001

The NAND flash memory 100 performs the same operation as the operation described in the first embodiment.

S1002

When the command sequence is determined as being received (YES in step S1001), the sequencer 111 stores data of the received page in a cache (not illustrated).

Then, the sequencer 111 starts the program operation.

Hereinafter, with reference to FIG. 12, an operation of the driver 151 related to an unselected block in the program operation will be described. An operation of the driver 151 related to a selected block is the same as the operation described in step S1002 according to the first embodiment.

Driver Related to Unselected Block

A description will be made of an operation of the driver 151 related to an unselected block in the program operation. Operations at the time point T0 and the time point T1 are the same as the operations at the time point T0 and the time point T1, described in the first embodiment.

Figure 12:
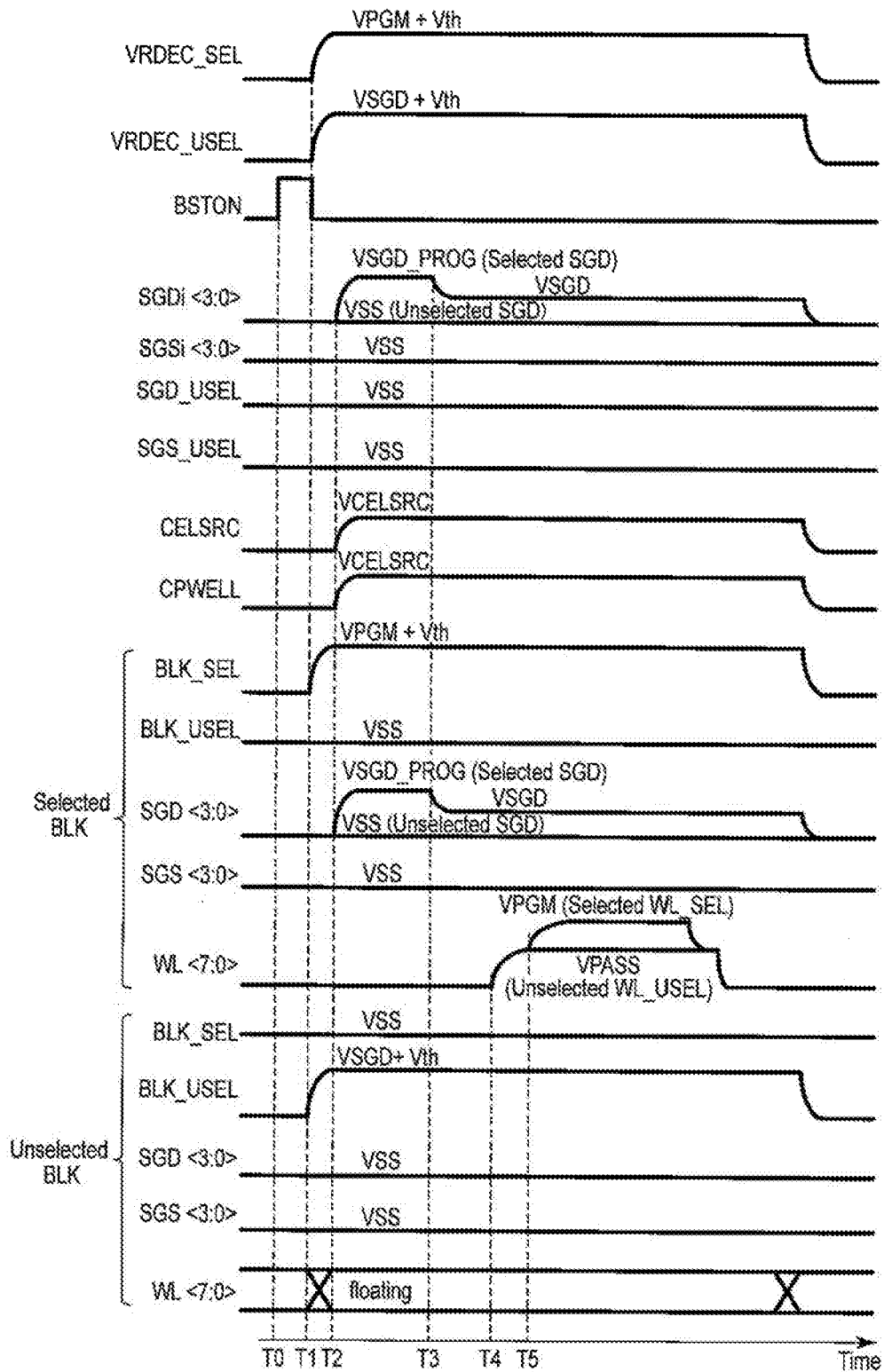
FIG. 12 is a waveform diagram illustrating a program operation according to a second modification example of the first embodiment.

As illustrated in FIG. 12, at the time point T2, in response to a command from the sequencer 111, the source line driver 160 sets a voltage applied to the source line contact CELSRC as "VCELSRC". At the time point T2, in response to a command from the sequencer 111, the well driver 170 sets a voltage applied to the well contact CPWELL as "VCELSRC". At the time point T2, in response to a command from the sequencer 111, the driver 114 sets a voltage applied to the select gate line SGD (unselected block) and the select gate line SGS (unselected block) as "VSS".

Operations in a period between the time point T3 and the time point T5 are the same as the operations in the period between the time point T3 and the time point T5, described in the first embodiment.

In the present modification example, during the data program operation in the selected block, the sequencer 111 applies the voltage "VCELSRC" which is the same as the voltage applied to the source line contact CELSRC, to the well contact CPWELL.

Meanwhile, as illustrated in FIG. 10, in the program operation, the sequencer 111 may set a voltage applied to the well contact CPWELL of the unselected block as "VSS". In such a case, a potential difference occurs between the source line contact CELSRC and the substrate 101, and thus a parasitic capacitance occurs. For this reason, during the program operation, current consumption required to charge the source line contact CELSRC may increase.

However, in Modification Example 2, during the program operation, the sequencer 111 applies the voltage "VCELSRC" which is applied to the source line contact, to the well contact CPWELL of the unselected block. For this reason, when compared with the above-described program operation Modification Example 1, in the program operation according to the present modification example, a parasitic capacitance can be prevented from occurring between the source line contact CELSRC and the substrate 101. Consequently, during the program operation, current consumption required to charge the source line contact CELSRC can be minimized.

S1003 to S1007

The sequencer 111 performs the same operations as the operations described in the first embodiment.

The sequencer 111 repeatedly performs the operations in steps S1002 to S1007 until the sequencer determines that the verification operation in step S1004 is successful, or the number of loops NWLn_loop reaches the maximum value in step S1005.

The Modification Example 2 may be combined with the first embodiment or Modification Example 1.

In the Modification Example 2, during the program operation, the sequencer 111 applies the voltage "VSS" to the gate electrode SGD of the select transistor ST1 of the unselected block, and applies the voltage "VSS" to the select gate line SGS of the select transistor ST2 of the unselected block, but Modification Example 2 is not limited thereto. For example, the sequencer 111 may apply a voltage between the voltage "VSS" and the voltage "VCELSRC" to the gate electrode SGD of the select transistor ST1 or the select gate line SGS of the select transistor ST2 of the unselected block.

Second Embodiment

Next, the second embodiment will be described. In the present embodiment, a configuration of the driver 151 of the row decoder 150 is different from the configuration of the driver 151 of the row decoder 150 described in the first embodiment. The basic configuration and operation of a memory device according to the second embodiment are the same as those of the operation of the memory device according to the first embodiment. Therefore, description of the content described in the first embodiment and content which can be easily analogized from the first embodiment will be omitted.

Row Decoder

Next, with reference to FIG. 13, the driver 151 according to the present embodiment will be described.

The driver 151 includes an address decoder/level shifter 153, and nMOS transistors 151a, 151b, 151c, 151f and 151g.

The address decoder/level shifter 153 receives a signal BSTON, a signal PROG, a signal VRDEC_SEL, and a signal VRDEC_USEL, and receives a block address. The address decoder/level shifter 153 outputs a signal BLK_SEL based on the signal BSTON, the signal VRDEC_SEL, and the block address. The address decoder/level shifter 153 outputs a signal BLK_USEL_SGD based on the signal BSTON, the signal VRDEC_USEL, and the block address. The address decoder/level shifter 153 outputs a signal BLK_USEL_SGS based on the signal BSTON, the signal PROG, the signal VRDEC_USEL, and the block address.

Figure 14:
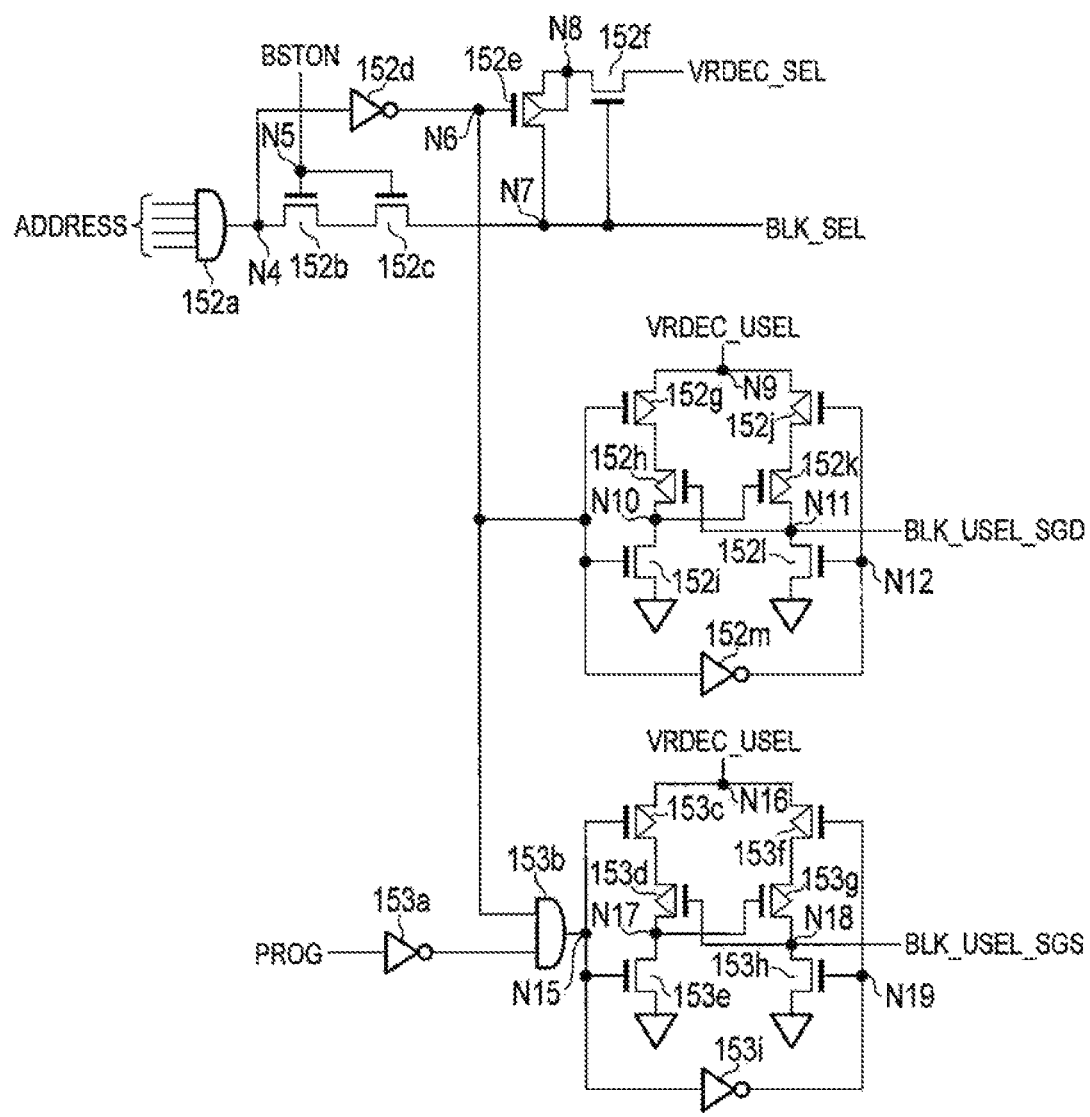
FIG. 14 is a circuit diagram illustrating a configuration of an address decoder/level shifter according to the second embodiment.

With reference to FIG. 14, a configuration of the address decoder/level shifter 153 will be described in detail. As illustrated in FIG. 14, the address decoder/level shifter 153 includes an address decoder 152a, nMOS transistors 152b, 152c, 152f, 152i, 152l, 153e and 153h, pMOS transistors 152e, 152g, 152h, 152j, 152k, 153c, 153d, 153f and 153g, inverters 152d, 152m, 153a and 153i, and an OR circuit 153b.

The pMOS transistors 153c and 153f and the nMOS transistors 153e and 153h are turned on or off based on an output from the inverter 153a and a potential of a node N6. The pMOS transistor 153g is turned on or off based on a potential of a node N17. The pMOS transistor 153d is turned on or off based on a potential of a node N18. The signal VRDEC_USEL is supplied to sources of the pMOS transistors 153c and 153f.

Figure 13:
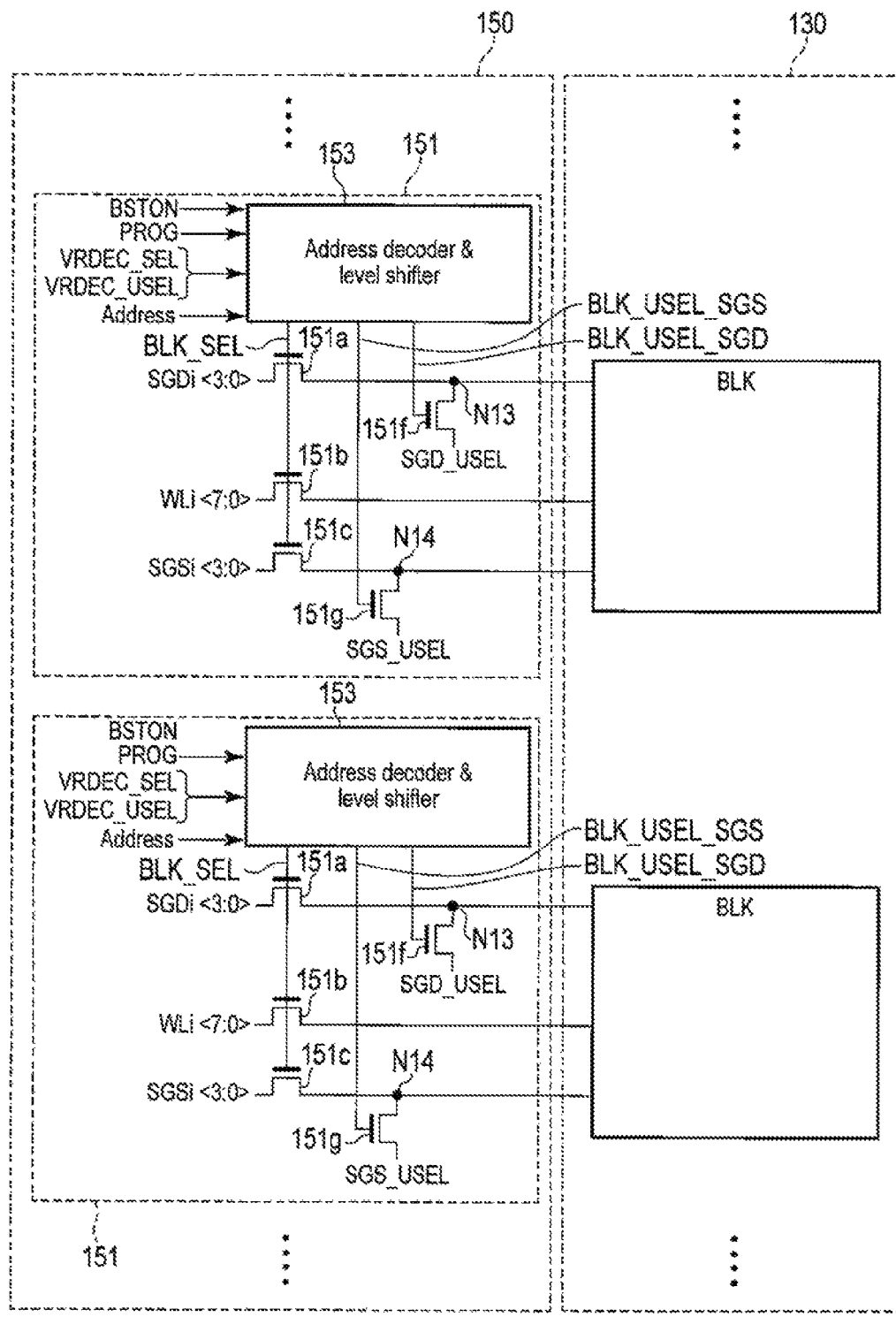
FIG. 13 is a block diagram illustrating a configuration of a row decoder according to a second embodiment.

As illustrated in FIG. 13, the signal BLK_USEL_SGD is input to a gate of the nMOS transistor 151f of which a drain is connected to a signal line SGD_USEL and a source is connected to a node N13. The signal BLK_USEL_SGS is input to a gate of the nMOS transistor 151g of which a drain is connected to a signal line SGS_USEL and a source is connected to a node N14.

Details of Data Writing Operation According to Second Embodiment

Next, with reference to a flowchart illustrated in FIG. 7, a description will be made of a data writing operation of the semiconductor memory device according to the present embodiment. Operations are the same as the operations described in the first embodiment except for step S1002.

S1002

When the command sequence is determined as being received (YES in step S1001), the sequencer 111 stores data of the received page in a cache (not illustrated).

Then, the sequencer 111 starts the program operation.

Hereinafter, an operation of the driver 151 related to an unselected block in the program operation will be described. An operation of the driver 151 related to a selected block in this step is the same as the operation described in step S1002 of the first embodiment.

Driver Related to Unselected Block

A description will be made of an operation of the driver 151 related to an unselected block according to the program operation.

Figure 15:
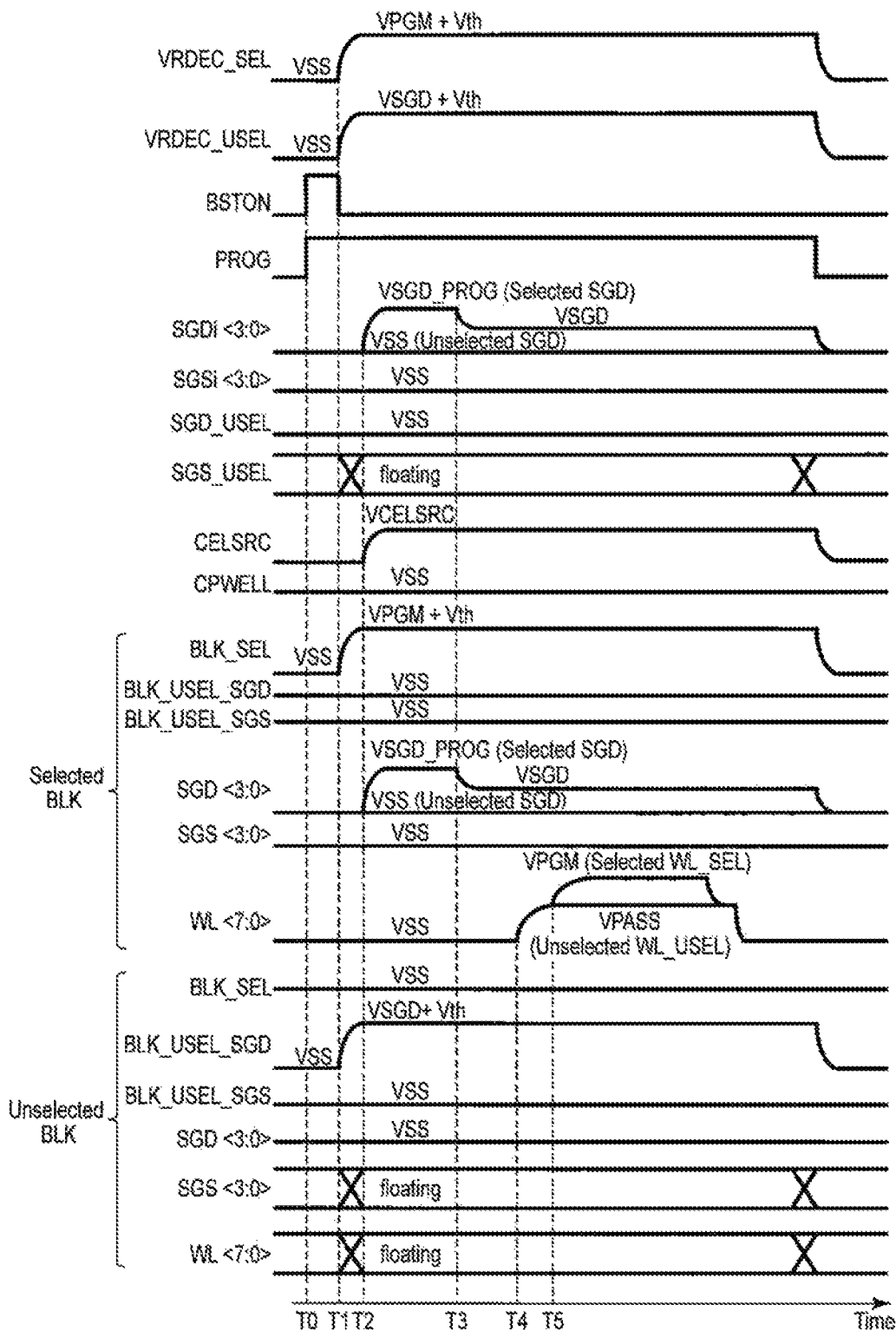
FIG. 15 is a waveform diagram illustrating a program operation according to the second embodiment.

As illustrated in FIG. 15, at the time point T0, in response to a command from the sequencer 111, the driver 114 changes a level of the signal BSTON from an "L" level to an "H" level. In response to a command from the sequencer 111, the driver 114 changes a level of the signal PROG from an "L" level to an "H" level.

Next, referring to FIG. 14 again, a description will be made of an operation of the address decoder/level shifter 153 related to an unselected block at the time point T0 will be described. Herein, description of the same operation as the operation described in the first embodiment will not be repeated. As illustrated in FIG. 14, at the time point T0, the signal PROG has an "H" level, and thus the inverter 153a outputs a signal with an "L" level. A signal with an "H" level and a signal with an "L" level are input to the OR circuit 153b which thus outputs a signal with an "L" level. Consequently, the transistor 153c is turned on, and the transistor 153e is turned off. A signal with an "H" level is supplied to a node N19 via the inverter 153i so that the transistor 153f is turned off and the transistor 153h is turned on. Thus, the node N18 is set to an "L" level. As a result, the transistor 153d is turned on.

Next, as illustrated in FIG. 14, as described in the first embodiment, at the time point T1, a voltage of a node N11 of the address decoder/level shifter 153 related to the unselected block BLK is "VSGD+Vth". Consequently, a voltage of the signal BLK_USEL_SGD becomes "H (VSGD+Vth)" level.

Since the transistors 153f and 153g are turned off, and the transistor 153h is turned on, the node N18 has a ground potential. Consequently, the signal BLK_USEL_SGS is set to an "L" level.

Thus, the transistors 151a, 151b, 151c and 151g are turned off, and the transistor 151f is turned on (refer to FIG. 13).

Therefore, the signal line SGD_USEL is electrically connected to the select gate line SGD<3:0> of the unselected block BLK of the memory cell array 130. The select gate line SGS<3:0> of the unselected block BLK of the memory cell array 130 is connected to neither the signal line SGS_USEL nor the select gate line SGSi<3:0> and thus enters an electrically floating state. The word line WL of the unselected block BLK of the memory cell array 130 is not connected to the signal line WLi and thus enters an electrically floating state.

At the time point T2, in response to a command from the sequencer 111, the driver 114 sets a voltage applied to the select gate line SGD (unselected block) to "VSS". At the time point T2, in response to a command from the sequencer 111, the source line driver 160 sets a voltage applied to the source line contact CELSRC as "VCELSRC". At the time point T2, the sequencer 111 causes the signal SGS_USEL to enter a floating state.

Operations of the sequencer 111 in a period between the time point T3 and the time point T5 are the same as the operations of the NAND flash memory 100 in the period between the time point T3 and the time point T5, described in Modification Example 1.

As mentioned above, when the select gate line SGS is in a floating state, a parasitic capacitance between the source line contact CELSRC and the select transistor ST2 can be minimized. As a result, the same effect as the effect described in Modification Example 1 can be achieved.

S1003 to S1007

The sequencer 111 performs the same operations as the operations described in the first embodiment.

The sequencer 111 repeatedly performs the operations in steps S1002 to S1007 until the sequencer determines that the verification operation in step S1004 is successful, or the number of loops NWLn_loop reaches the maximum value in step S1005.

Operations and Effects According to Second Embodiment

According to the above-described embodiment, in the program operation, the gate electrode of the select transistor of the unselected block enters a floating state. Consequently, the same effect as the effect of Modification Example 1 can be achieved.

In the second embodiment, during the program operation, the sequencer 111 applies the voltage "VSS" to the gate electrode SGD of the select transistor ST1 of the unselected block, but the second embodiment is not limited thereto. For example, the sequencer 111 may apply a voltage between the voltage "VSS" and the voltage "VCELSRC" to the gate electrode SGD of the select transistor ST1 of the unselected block.

In the second embodiment, during the program operation, the sequencer 111 causes the gate electrode SGS of the select transistor ST2 of the unselected block to enter a floating state, and applies the voltage "VSS" to the gate electrode SGD of the select transistor ST1 of the unselected block, but the second embodiment is not limited thereto. For example, during the program operation, the sequencer 111 may apply the voltage "VSS" to the gate electrode SGS of the select transistor ST2 of the unselected block, and may cause the gate electrode SGD of the select transistor ST1 of the unselected block to enter a floating state. In this case, the sequencer 111 may apply a voltage between the voltage "VSS" and the voltage "VCELSRC" to the gate electrode SGS of the select transistor ST2 of the unselected block.

Third Embodiment

Next, a third embodiment will be described. The present embodiment applies the first embodiment and Modification Example 1 to a memory cell array which is different from the memory cell array described in the first embodiment. The basic configuration and operation of a memory device according to the third embodiment are the same as those of the memory device according to the first embodiment. Therefore, description of the content described in the first embodiment and content which can be easily analogized from the first embodiment will be omitted.

Semiconductor Memory Device According to Third Embodiment

Next, a configuration of the NAND flash memory 100 will be described.

Figure 16:
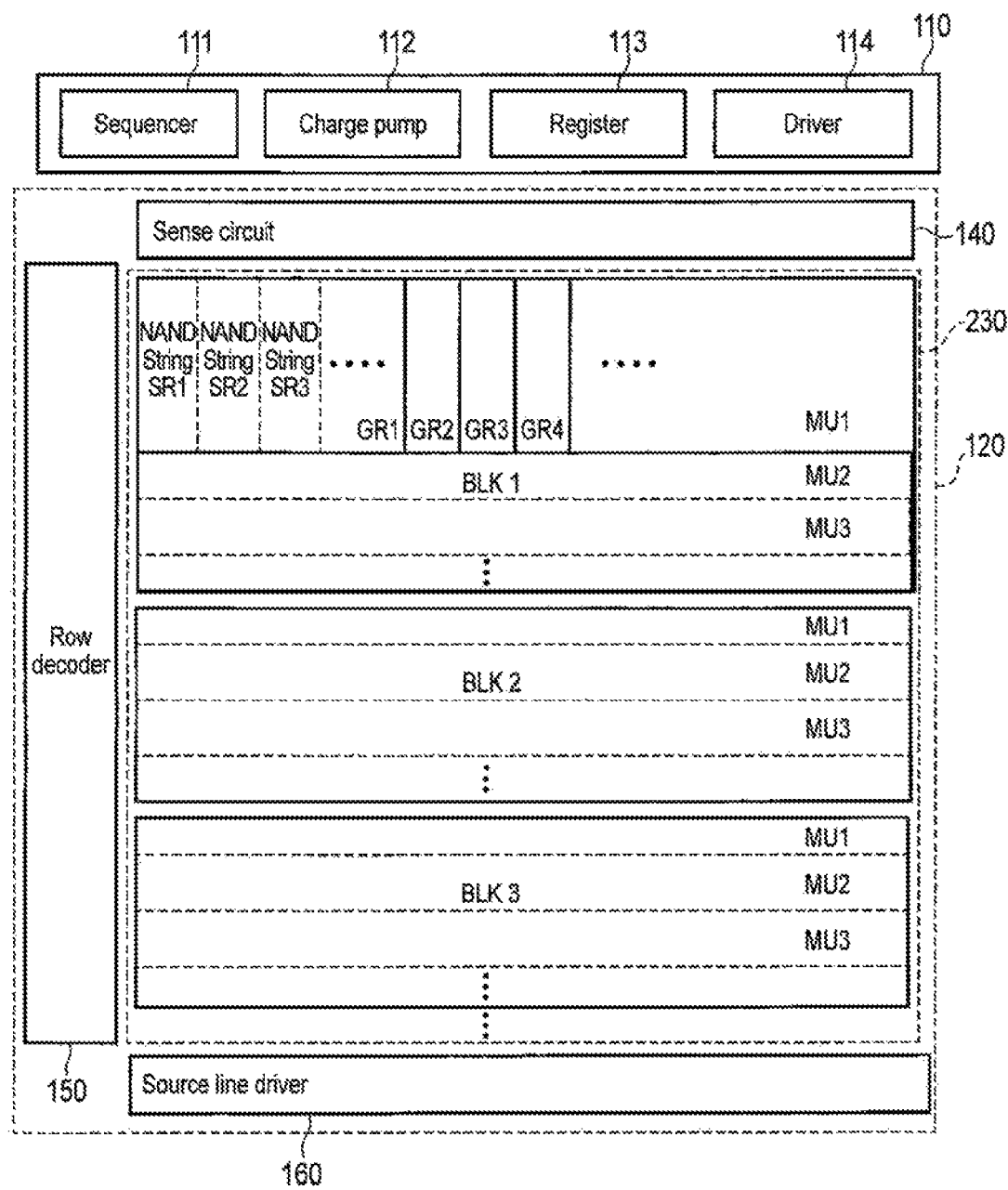
FIG. 16 is a block diagram illustrating a configuration of a NAND flash memory according to a third embodiment.

FIG. 16 is a block diagram of the NAND flash memory 100 according to the present embodiment. As illustrated in FIG. 16, the core section 120 includes a memory cell array 230, a row decoder 150, a sense circuit 140, and a source line driver 160.

The memory cell array 230 includes a plurality of blocks BLK (BLK1, BLK2, . . . ) which are sets of the plurality of nonvolatile memory cell transistors MT. Data items in the same block BLK are collectively erased. Each block BLK includes a plurality of a plurality of memory units MU (MU1, MU2, . . . ) which are sets of memory cell transistors MT each of which is associated with a word line and a bit line. Each of the memory units MU includes a plurality of string groups GR (GR1, GR2, GR3, GR4, . . . ) which are sets of a plurality of NAND strings SR (SR1, SR2, SR3, . . . ) in which the memory cell transistors are connected in series to each other. Of course, the number of memory units MU in the memory cell array 230, the number of string groups GR in a single memory unit MU, or the number of NAND strings SR in a single string group is arbitrary. Details of the memory cell array 230 will be described later.

Configuration of Memory Cell Array According to Third Embodiment

Figure 17:
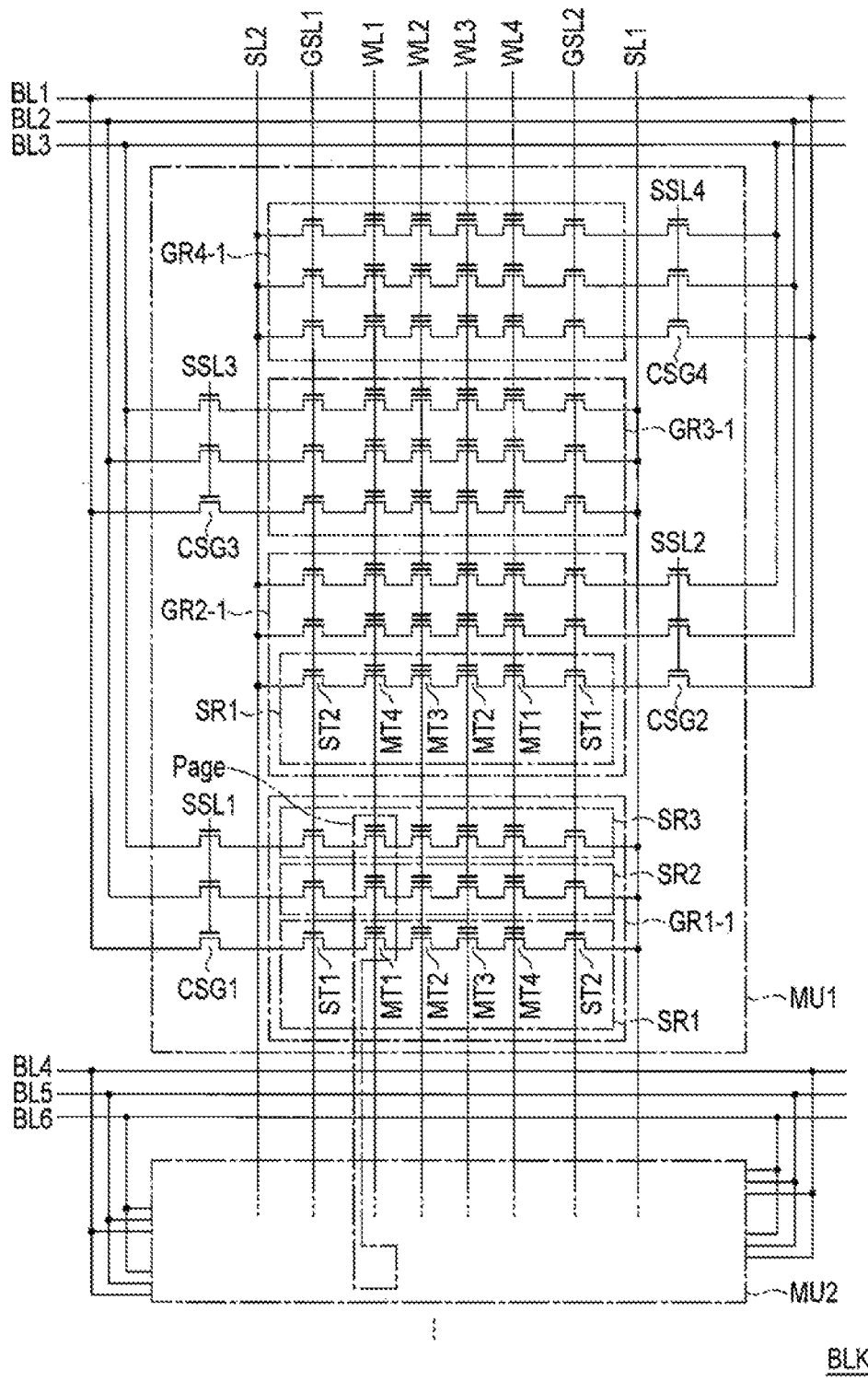
FIG. 17 is a circuit diagram illustrating a configuration of a memory cell array according to the third embodiment.
Figure 18:
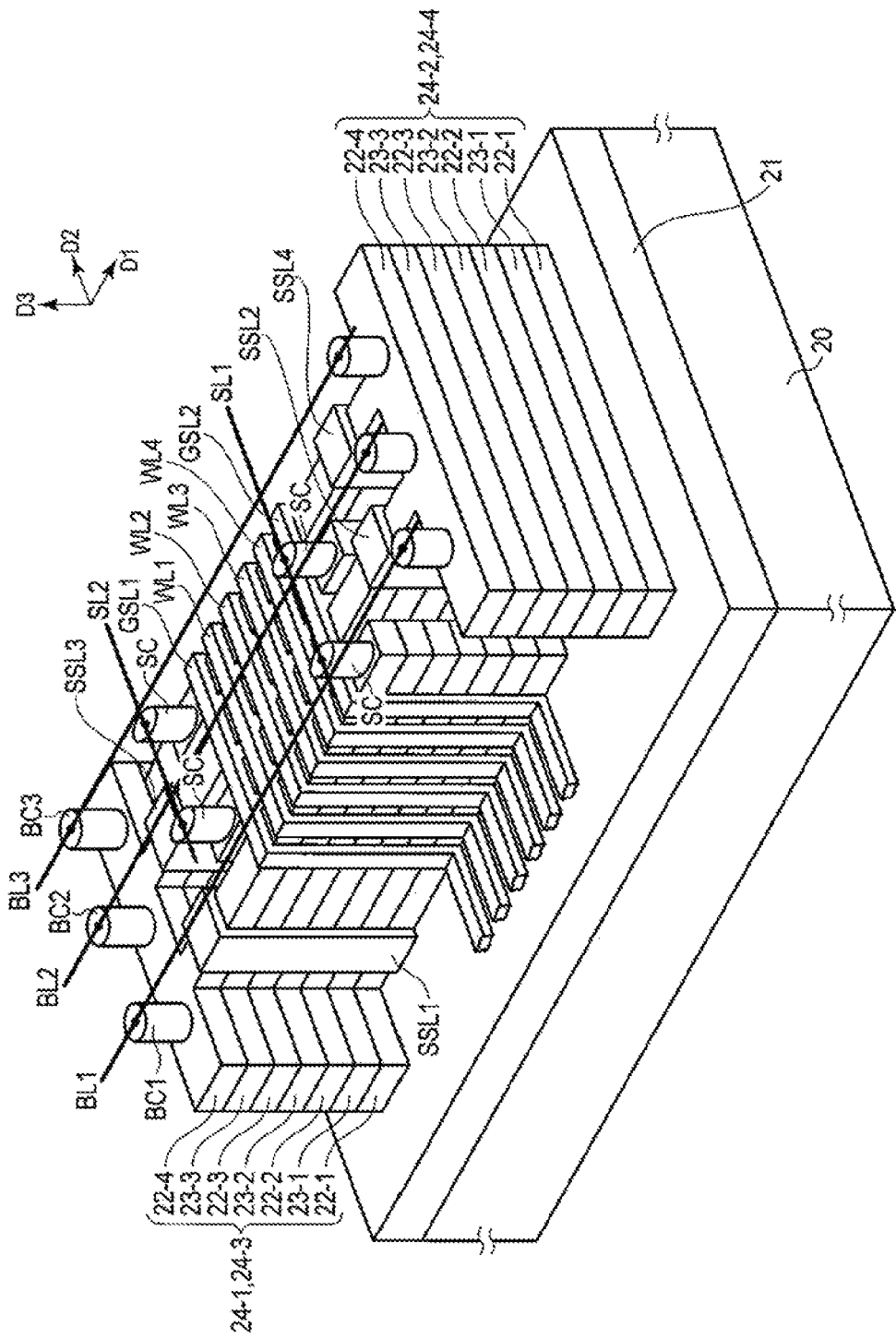
FIG. 18 is a perspective view illustrating a single memory unit of the memory cell array according to the third embodiment.
Figure 19:
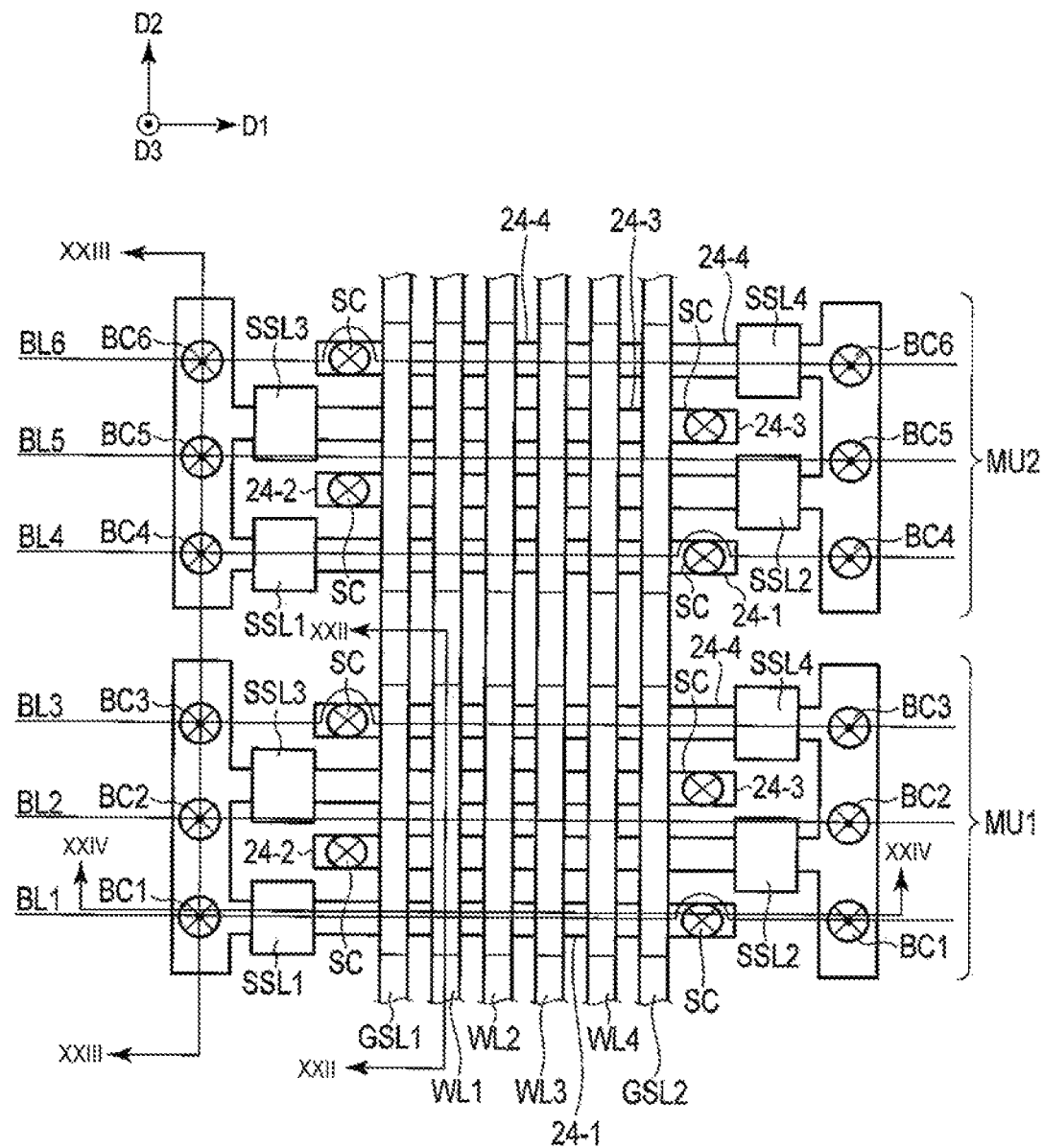
FIG. 19 is a plan view illustrating two memory units of the memory cell array according to the third embodiment.

FIG. 17 is a circuit diagram illustrating the memory cell array 230 according to the present embodiment. As illustrated in FIG. 17, in the memory cell array 230, each block BLK includes a plurality of memory units MU (MU1, MU2, and MU3). Only the three memory units MU are illustrated in FIG. 17, but the number thereof may be four or more, and is not limited thereto.

Each of the memory units MU includes, for example, four string groups GR (GR1 to GR4). Of course, the number of string groups GR is not limited to four, and may be three or less, and may be five or more. When the string groups GR are differentiated from each other in the memory units MU, the string groups GR of the memory unit MU1 are respectively referred to as GR1-1 to GR4-1, and the string groups GR of the memory unit MU2 are respectively referred to as GR1-2 to GR4-2.

Each of the string groups GR includes, for example, three NAND strings SR (SR1 to SR3). Of course, the number of NAND strings SR is not limited to three, and may be four or more. Each of the NAND strings SR includes select transistors ST1 and ST2, and four memory cell transistors MT (MT1 to MT4). The number of memory cell transistors MT is not limited to four, and may be five or more, and may be three or less. Each of the memory cell transistors MT is provided with a stacked gate including a control gate and a charge storage layer, and stores data in a nonvolatile manner. The memory cell transistors MT are connected in series between a source of the select transistor ST1 and a drain of the select transistor ST2. The memory cell transistor MT may be of an MONOS type in which an insulating film is used as the charge storage layer, or may be of an FG type in which a conductive layer is used as the charge storage layer. In a case of the MONOS type, the charge storage layer is continuously provided between the adjacent memory cell transistors, and, in a case of the FG type, the charge storage layer is separately provided for each memory cell transistor. Hereinafter, as an example, a description will be made of a case where the memory cell transistor MT is of the MONOS type.

In the string group GR, the three NAND strings SR1 to SR3 are sequentially stacked on a semiconductor substrate, the NAND string SR1 is formed in the lowermost layer, the NAND string SR2 is formed in the intermediate layer, and the NAND string SR3 is formed in the uppermost layer. Gates of the select transistors ST1 and ST2 included in the same string group GR are respectively connected to the same select gate lines GSL1 and GSL2, and control gates of the memory cell transistors MT located in the same column are connected to the same word line WL. Drains of the three select transistors ST1 in a certain string group GR are connected to different bit lines BL via select transistors CSG, and sources of the select transistors ST2 are connected to the same source line SL.

Specifically, the drains of the select transistors ST1 of the odd-numbered string groups GR1 and GR3 are respectively connected to sources of the column select transistors CSG1 and CSG3, and the sources of the select transistors ST2 are connected in common to the source line SL1. On the other hand, the drains of the select transistors ST1 of the even-numbered string groups GR2 and GR4 are respectively connected to sources of the column select transistors CSG2 and CSG4, and the sources of the select transistors ST2 are connected in common to the source line SL2.

The gates of the select transistors ST1 of the string groups GR1 and GR3 and the gates of the select transistors ST2 of the string groups GR2 and GR4 are connected in common to the same select gate line GSL1. The gates of the select transistors ST2 of the string groups GR1 and GR3 and the gates of the select transistors ST1 of the string groups GR2 and GR4 are connected in common to the same select gate line GSL2.

In the string groups GR1 and GR3, the control gates of the memory cell transistors MT1, MT2, MT3 and MT4 are respectively connected to the word lines WL1, WL2, WL3 and WL4. In contrast, in the string groups GR2 and GR4, the control gates of the memory cell transistors MT4, MT3, MT2 and MT1 are respectively connected to the word lines WL1, WL2, WL3 and WL4.

In addition, the NAND strings SR1 of the four string groups GR1 to GR4 included in a certain memory unit MU are connected to the same bit line BL. The same is true for the NAND strings SR2 and SR3. In addition, different memory units MU are connected to different bit lines BL. More specifically, in the memory unit MU1, the drains of the select transistors ST1 of the NAND strings SR1 to SR3 of each of the string groups GR1 to GR4 are respectively connected to the bit lines BL1 to BL3 via the column select transistors CSG (CSG1 to CSG4). The column select transistors CSG have the same configuration as, for example, configurations of the memory cell transistors MT or the select transistors ST1 and ST2, and select a single string group GR which will be connected to the bit lines BL in each of the memory units MU. Therefore, gates of the column select transistors CSG1 to CSG4 associated with each string group GR are controlled by different control signal lines SSL1 to SSL4.

A plurality of memory units MU each having the above-described configuration are arranged in the vertical direction in FIG. 17. The plurality of memory units MU share the word lines WL and the select gate lines GSL1 and GSL2 with the memory unit MU1. On the other hand, the bit lines BL are separately provided for each memory unit, and, for example, the memory unit MU2 is associated with three bit lines BL4 to BL6 different from those of the memory unit MU1. Similarly, the memory unit MU3 is associated with the bit lines BL7 to BL9. In other words, the number of bit lines BL associated with each memory unit MU corresponds to a total number of NAND strings SR included in a single string group GR. Therefore, when there are four layers of NAND strings, the number of bit lines corresponding to a single memory unit MU is also four, and this is also the same for other numbers. The control signals SSL1 to SSL4 are common to the memory units MU.

In the above-described configuration, a set of plural memory cell transistors MT connected to the same word line WL in a single string group GR selected from each memory unit MU forms a "page". Writing and reading of data are performed in the page unit. For example, in FIG. 17, when the signal line SSL1 and the word line WL1 are selected, a single page is formed by the memory cell transistors MT connected to the word line WL1 in the string group GR1-1 of the memory unit MU1 and the string group GR1-2 of the memory unit MU2. The six memory cell transistors MT1 included in this page are respectively connected to the bit lines BL1 to BL6. When three memory units MU are provided, the memory cell transistors MT1 in the string group GR1-3 of the memory unit MU3 are included in the page. This is also the same for a case where other signal lines SSL or word lines WL are selected.

As illustrated in FIGS. 18 to 22, an insulating film 21 is provided on the semiconductor substrate 20, and the memory cell array 230 is provided on the insulating film 21.

Four fin type structures 24 (24-1 to 24-4) having a stripe shape in the D1 direction perpendicular to D3 direction, which is a vertical direction to the surface of the semiconductor substrate 20, are provided on the insulating film 21, and thus a single memory unit MU is formed. Each of the fin type structures 24 includes insulating films 22 (22-1 to 22-4) and semiconductor layers 23 (23-1 to 23-3) which are alternately stacked on each other. Each of the fin type structures 24 corresponds to the string group GR described in FIG. 17. The lowermost semiconductor layer 23-1 corresponds to a current path (a region where a channel is formed) of the NAND string SR1; the uppermost semiconductor layer 23-3 corresponds to a current path of the NAND string SR3; and the semiconductor layer 23-2 interposed therebetween corresponds to a current path of the NAND string SR2.

Figure 20:
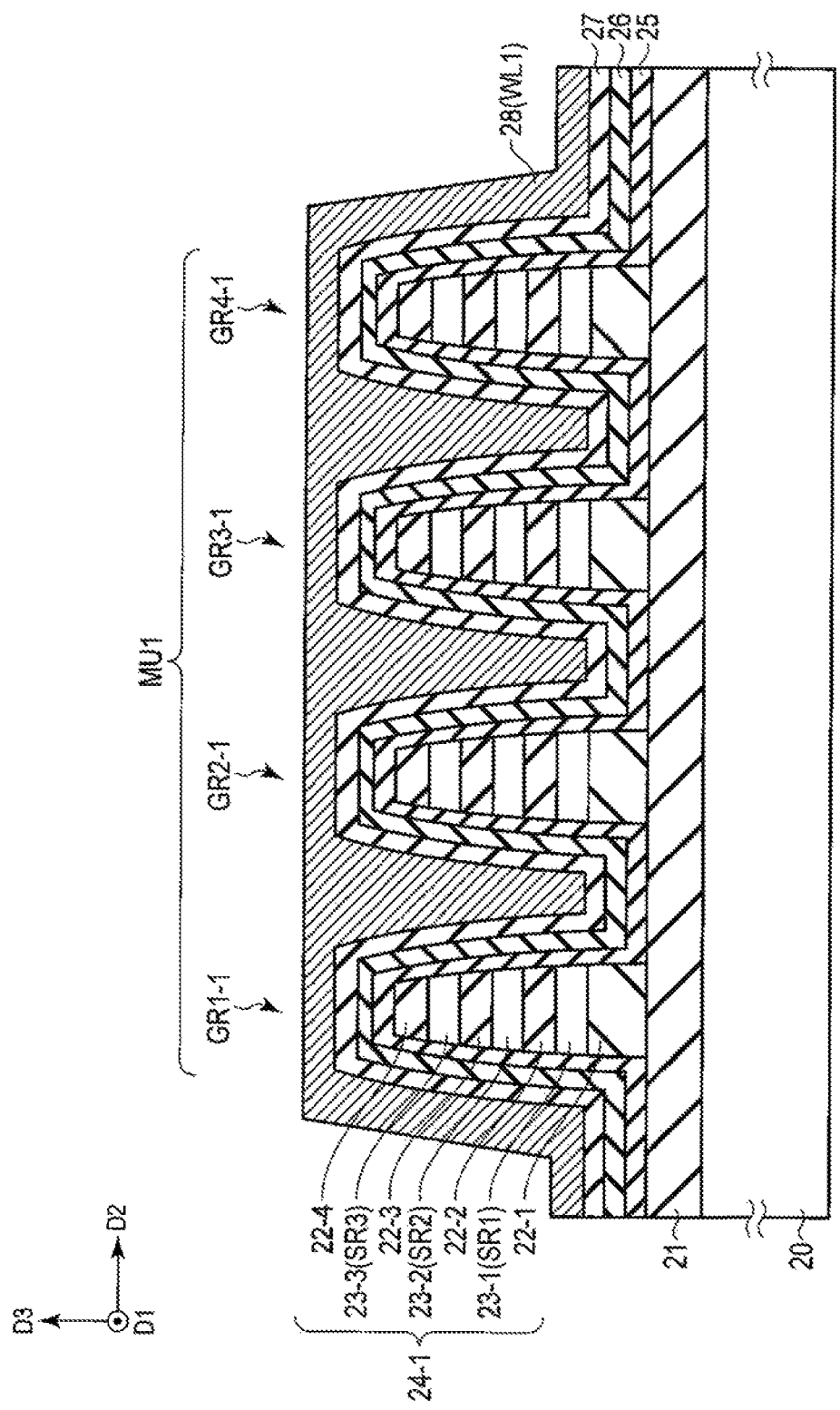
FIG. 20 is a sectional view taken along line XX-XX in FIG. 19.
Figure 21:
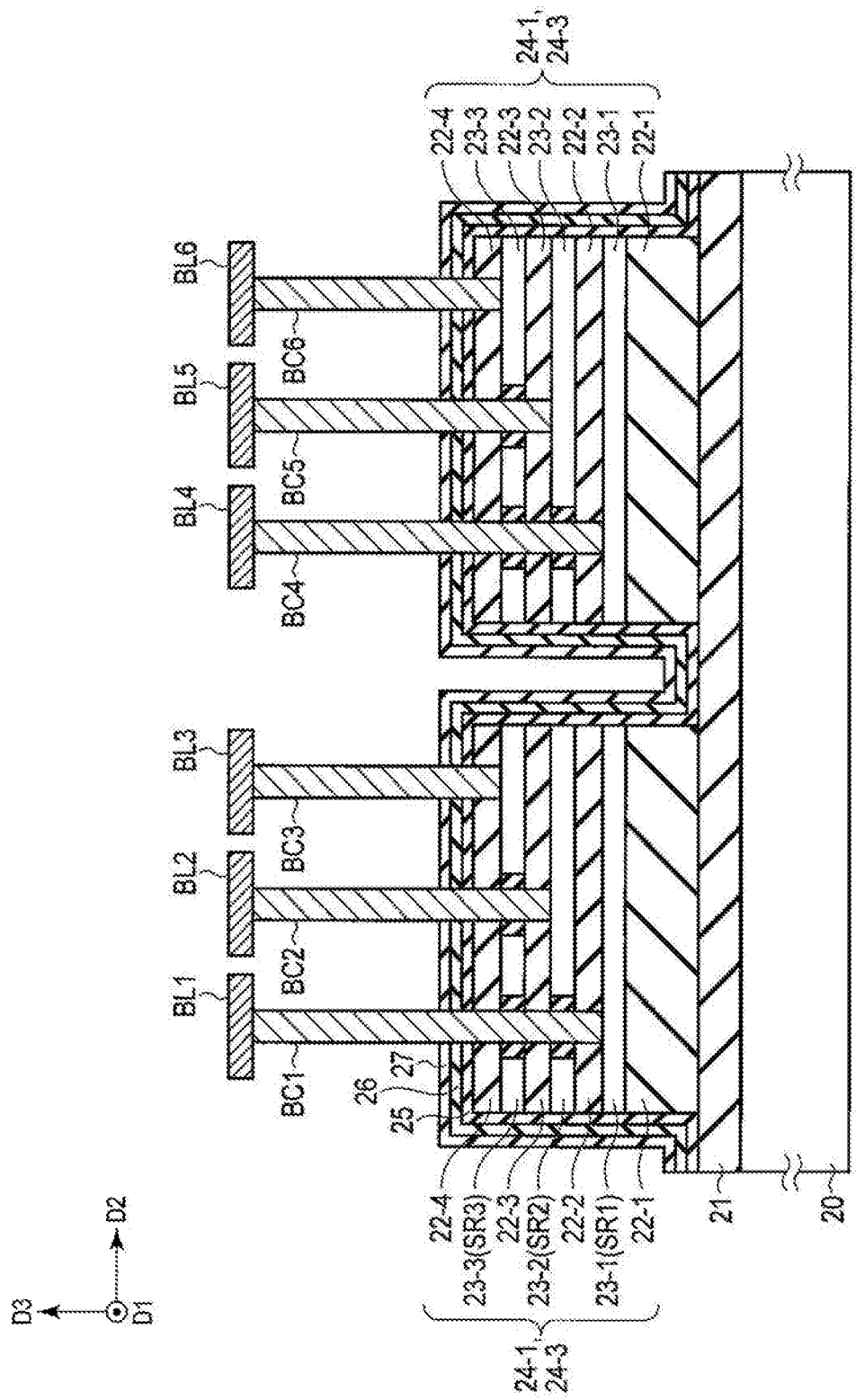
FIG. 21 is a sectional view taken along line XXI-XXI in FIG. 19.

A tunnel insulating film 25, a charge storage layer 26, a block insulating film 27, and a conductive film 28 are sequentially provided on upper surfaces and side surfaces of the fin type structures 24 (refer to FIG. 20). The charge storage layer 26 is formed of, for example, an insulating film. In addition, the conductive film 28 is made of, for example, metal, and functions as the word line WL or the select gate lines GSL1 and GSL2. The word line WL and the select gate lines GSL1 and GSL2 are formed to cross over the plurality of fin type structures 24 among the plurality of memory units MU. On the other hand, control signal lines SSL1 to SSL4 are independently provided for each of the fin type structures 24.

First ends of the fin type structures 24 are extracted to the end of the memory cell array 230, and are connected to the bit lines BL in the extracted region. In other words, as an example, looking at the memory unit MU1, the first ends of the odd-numbered fin type structures 24-1 and 24-3 are extracted to a certain region in the D1 direction and are connected in common, and contact plugs BC1 to BC3 are formed in this region. The contact plug BC1 formed in this region connects the semiconductor layer 23-1 of the string groups GR1 and GR3 to the bit line BL1, and is insulated from the semiconductor layers 23-2 and 23-3. The contact plug BC2 connects the semiconductor layer 23-2 of the string groups GR1 and GR3 to the bit line BL2, and is insulated from the semiconductor layers 23-1 and 23-3. The contact plug BC3 connects the semiconductor layer 23-3 of the string groups GR1 and GR3 to the bit line BL3, and is insulated from the semiconductor layers 23-1 and 23-2.

On the other hand, first ends of the even-numbered fin type structures 24-2 and 24-4 are extracted to a region opposite to the first ends of the fin type structures 24-1 and 24-3 in the D1 direction and are connected in common, and contact plugs BC1 to BC3 are formed in this region. The contact plug BC1 formed in this region connects the semiconductor layer 23-1 of the string groups GR2 and GR4 to the bit line BL1, and is insulated from the semiconductor layers 23-2 and 23-3. The contact plug BC2 connects the semiconductor layer 23-2 of the string groups GR2 and GR4 to the bit line BL2, and is insulated from the semiconductor layers 23-1 and 23-3. The contact plug BC3 formed in this region connects the semiconductor layer 23-3 of the string groups GR2 and GR4 to the bit line BL3, and is insulated from the semiconductor layers 23-1 and 23-2.

As described above, the odd-numbered fin type structures 24-1 and 24-3 (that is, the string groups GR1 and GR3) and the even-numbered fin type structures 24-2 and 24-4 (that is, the string groups GR2 and GR4) are arranged so that the NAND strings SR are opposite to each other in their positional relationship. For example, in FIG. 19, the odd-numbered fin type structures 24-1 and 24-3 are connected to the bit lines BL on the left side of the drawing, and the control signal lines SSL1 and SSL3 are arranged on the left side of the drawing. Therefore, the select transistor ST1 is located on the left side of the drawing, and the select transistor ST2 is located on the right side of the drawing. The memory cell transistors MT1 to MT4 are located in this order from the left side of the drawing. In contrast, the even-numbered fin type structures 24-2 and 24-4 are connected to the bit lines BL on the right side of the drawing, and the control signal lines SSL2 and SSL4 are arranged on the right side of the drawing. Therefore, the select transistor ST1 is located on the right side of the drawing, and the select transistor ST2 is located on the left side of the drawing. The memory cell transistors MT1 to MT4 are located in this order from the right side of the drawing.

Of course, the above description relates to the memory unit MU1. For example, in the memory unit MU2, contact plugs BC4 to BC6 are formed, and respectively connect the semiconductor layers 23-1 to 23-3 to bit lines BL4 to BL6 (refer to FIG. 21).

The contact plugs SC are formed on second ends of the fin type structures 24. The contact plugs SC connect the semiconductor layers 23-1 to 23-3 to the source line SL.

In the above-described configuration, the memory cell transistors MT included in the NAND strings SR1 to SR3 may have different shapes due to processing characteristics or the like of dry etching in a manufacturing process. For example, when the insulating films 22 (22-1 to 22-4) and the semiconductor layers 23 (23-1 to 23-3) which are alternately stacked are collectively processed, as illustrated in FIG. 20, a width of a processed shape may decrease toward the upper layer, and a side surface may be curved. In this case, a length of the side surface of the semiconductor layer 23 which is viewed from a plane formed in the D3 direction and the D2 direction, that is, the memory cell transistor MT formed in the semiconductor layer 23-1 is shortest in terms of a gate length of the memory cell transistor MT. The memory cell transistor MT formed in the semiconductor layer 23-2 is second shortest. The memory cell transistor MT formed in the semiconductor layer 23-3 is longest. In other words, the gate length increases toward the memory cell transistors MT located in the upper layer, and decreases toward the memory cell transistors MT located in the lower layer. In relation to widths of the semiconductor layers 23 in the D2 direction, the semiconductor layer 23-1 is widest, the semiconductor layer 23-2 is second widest, and the semiconductor layer 23-3 is narrowest. In other words, the widths of the semiconductor layers 23 decrease toward the upper layer, and increase toward the lower layer.

Figure 22:
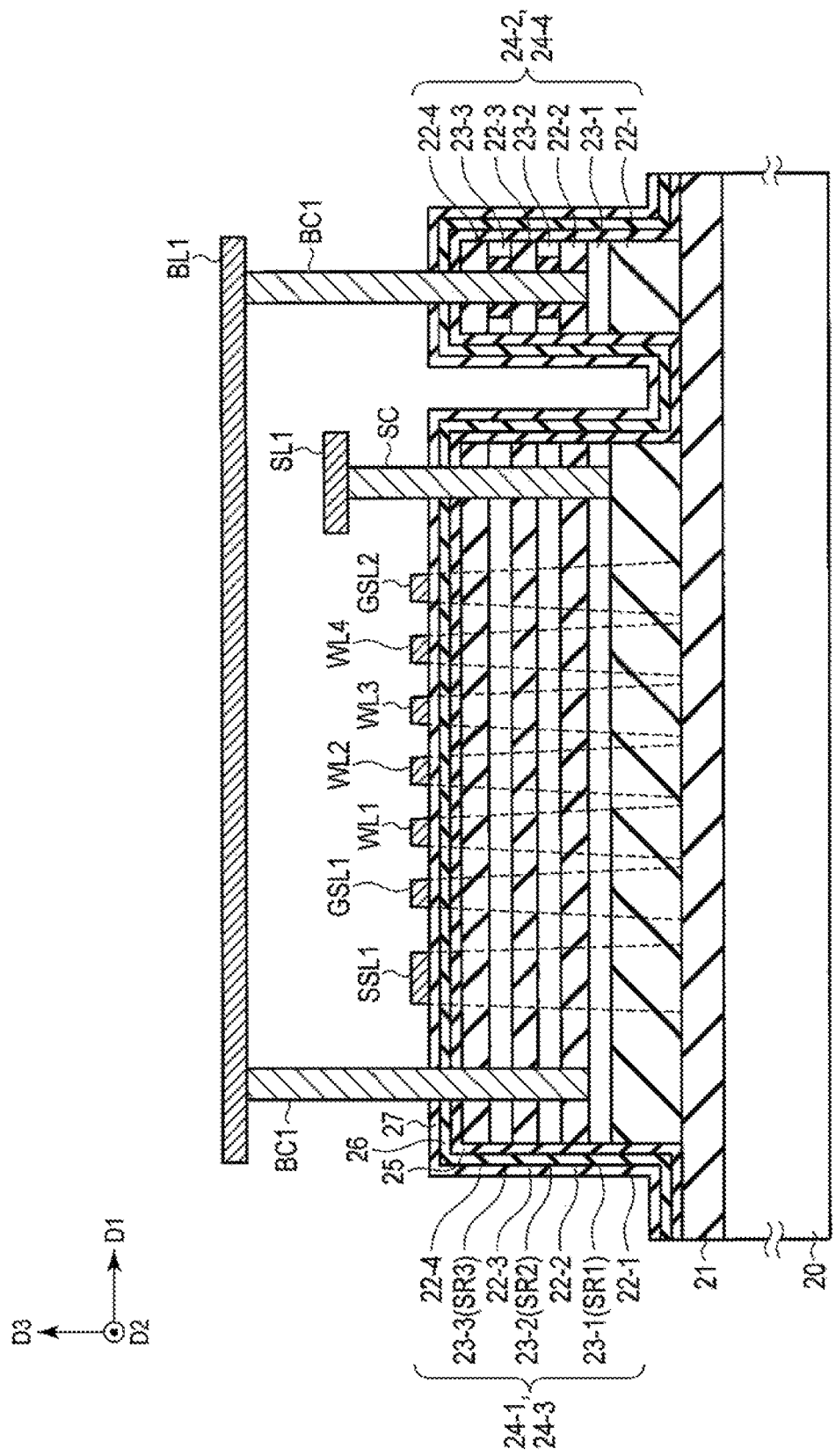
FIG. 22 is a sectional view taken along line XXII-XXII in FIG. 19.

In addition, the word line WL (the conductive film 28) may become narrower upward as illustrated in FIG. 22. As illustrated in FIG. 22, in relation to a width of the word line WL in the D1 direction, that is, a gate width of the memory cell transistor MT, the memory cell transistor MT formed in the semiconductor layer 23-1 is widest. The memory cell transistor MT formed in the semiconductor layer 23-2 is second widest. The memory cell transistor MT formed in the semiconductor layer 23-3 is narrowest. In other words, the gate width increases toward the lower layer, and decreases toward the upper layer.

As mentioned above, the memory cell transistors MT in the respective layers may have different shapes due to manufacturing variations. As a result, characteristics of the memory cell transistors MT vary for each layer. In the examples illustrated in FIGS. 20 and 22, a case where the processed layer becomes narrower upward, but there is a case where the layer may become narrower downward, or an intermediate portion may become narrower depending on dry etching characteristics. Therefore, variations in the characteristics of the memory cell transistors MT in the layers are not constant. However, the present embodiment is applicable to any case.

Row Decoder

Figure 23:
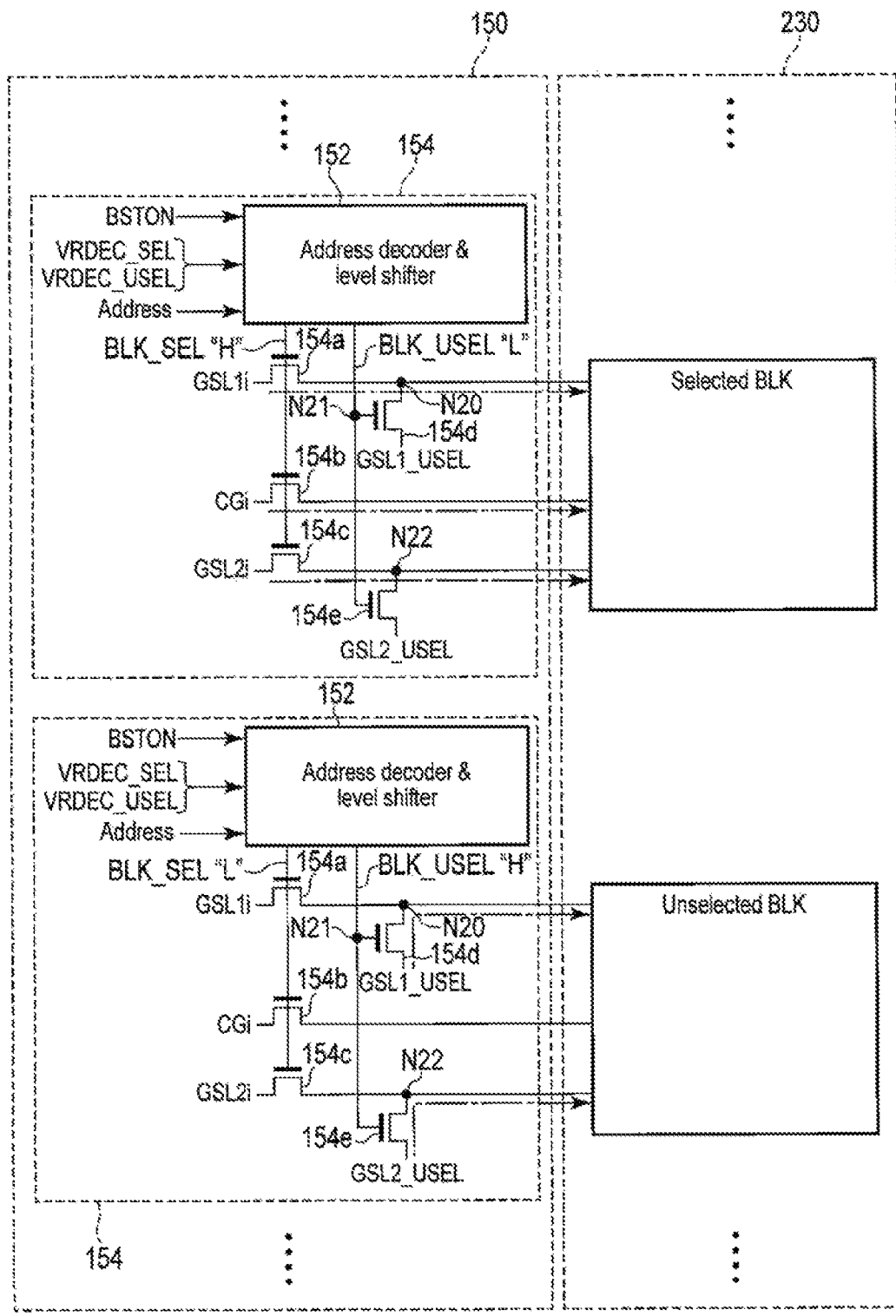
FIG. 23 is a block diagram illustrating a configuration of a row decoder according to the third embodiment.

Next, with reference to FIG. 23, the row decoder 150 according to the present embodiment will be described. The row decoder 150 includes a driver 154 for each block BLK of the memory cell array 230.

The driver 154 includes an address decoder/level shifter 152, and nMOS transistors 154a, 154b, 154c, 154d and 154e.

The signal BLK_SEL is input from the address decoder/level shifter 152 to a gate of the nMOS transistor 154a of which a drain is connected to the select gate line GSL1i and a source is connected to a node N20. The node N20 is connected to the select gate line GSL1 of any block BLK of the memory cell array 230.

The signal BLK_SEL is input from the address decoder/level shifter 152 to a gate of the nMOS transistor 154b of which a drain is connected to the signal line WLi and a source is connected to the word line WL of the memory cell array 230.

The signal BLK_SEL is input from the address decoder/level shifter 152 to a gate of the nMOS transistor 154c of which a drain is connected to the select gate line SGSi and a source is connected to a node N22. The node N22 is connected to the select gate line GSL2 of any block BLK of the memory cell array 230.

The signal BLK_USEL is input to a gate of the nMOS transistor 154d of which a drain is connected to the signal line SGD_USEL and a source is connected to the node N20. The signal BLK_USEL is input to a gate of the nMOS transistor 154e of which a drain is connected to the signal line SGS_USEL and a source is connected to the node N22.

The memory cell array 230 according to the present embodiment can perform the same operation as the operation of the memory cell array 130 according to the first embodiment and Modification Example 1 using the row decoder 150.

Specifically, during the program operation, the sequencer 111 sets voltages of the select gate line GSL1 and the select gate line GSL2 of the unselected block as a voltage applied to the source line SL, or causes the select gate line GSL1 and the select gate line GSL2 of the unselected block to enter an floating state.

For example, during the program operation, voltages of the select gate line GSL1 and the select gate line GSL2 of the unselected block may be set as "VSS". In such a case, current consumption required to charge the source line SL increases due to parasitic capacitances occurring between the select gate lines GSL1 and GSL2 and the contact plug SC.

However, according to the present embodiment, the parasitic capacitances occurring between the select gate lines GSL1 and GSL2 and the contact plug SC can be minimized. As a result, the same effect as the effect of the first embodiment can be achieved.

In the above-described respective embodiments, a case is described in which, during the program operation, a voltage applied to the gate of the select transistor of the unselected block or the well contact is controlled. However, the above-described respective embodiments are applicable to cases other than the program operation.

In the above-described respective embodiments, (1) a voltage applied to a word line which is selected in a reading operation in the A level is within a range, for example, from 0 V to 0.55 V. However, the voltage is not limited to this value, and may be within any one of ranges, for example, from 0.1 V to 0.24 V, from 0.21 V to 0.31 V, from 0.31 V to 0.4 V, from 0.4 V to 0.5 V, and from 0.5 V to 0.55 V.

A voltage applied to a word line which is selected in a reading operation in the B level is within a range, for example, from 1.5 V to 2.3 V. However, the voltage is not limited to this value, and may be within any one of ranges, for example, from 1.65 V to 1.8 V, from 1.8 V to 1.95 V, from 1.95 V to 2.1 V, and from 2.1 V to 2.3 V.

A voltage applied to a word line which is selected in a reading operation in the C level is within a range, for example, from 3.0 V to 4.0 V. However, the voltage is not limited to this value, and may be within any one of ranges, for example, from 3.0 V to 3.2 V, from 3.2 V to 3.4 V, from 3.4 V to 3.5 V, from 3.5 V to 3.6 V, and from 3.6 V to 4.0 V.

The period (tR) of the reading operation may be any one of periods, for example, from 25 µs to 38 µs, from 38 µs to 70 µs, and from 70 µs to 80 µs.

(2) The writing operation includes the program operation and the verification operation as described above. In the writing operation, a voltage which is initially applied to a word line selected during the program operation is within a range, for example, 13.7 V to 14.3 V. The voltage is not limited to this value, and may be within anyone of ranges, for example, 13.7 V to 14.0 V, and from 14.0 V to 14.6 V.

A voltage which is initially applied to a selected word line during a writing operation on odd-numbered word lines may be changed to a voltage which is initially applied to a selected word line during a writing operation on even-numbered word lines.

When the program operation is of an incremental step pulse program (ISPP) type, a step-up voltage is, for example, about 0.5 V.

A voltage applied to an unselected word line has a value in a range of, for example, from 6.0 V to 7.3 V. However, the voltage is not limited to this value, and may be a value in a range, for example, from 7.3 V to 8.4 V, and may be a value of 6.0 V or lower.

An applied pass voltage may be changed depending on whether an unselected word line is an odd-numbered word line or an even-numbered word line.

The period (tProg) of the writing operation may be any one of periods, for example, from 1,700 µs to 1,800 µs, from 1,800 µs to 1,900 µs, and from 1,900 µs to 2,000 µs.

(3) In the erasure operation, a voltage which is initially applied to the well which is formed in the upper portion of the semiconductor substrate and over which the memory cells are arranged is a value in a range, for example, from 12 V to 13.6 V. The voltage is not limited to this value, and may have a value in any one of ranges, for example, from 13.6 V to 14.8 V, from 14.8 V to 19.0 V, from 19.0 V to 19.8 V, and from 19.8 V to 21 V.

The period (tErase) of the erasure operation may be any one of periods, for example, from 3,000 µs to 4,000 µs, from 4,000 µs to 5,000 µs, and from 4,000 µs to 9,000 µs.

(4) The memory cell structure includes the charge storage layer which is arranged on the semiconductor substrate (a silicon substrate) via a tunnel insulating film with a film thickness of 4 nm to 10 nm. The charge storage layer may have a stack structure of an insulating film such as SiN or SiON with a film thickness of 2 mm to 3 mm and polysilicon with a film thickness of 3 mm to 8 mm. A metal such as Ru may be added to polysilicon. An insulating film is provided on the charge storage layer. This insulating film has, for example, a silicon oxide film with a film thickness of 4 nm to 10 nm, interposed between a lower-layer high-k film with a thickness of 3 nm to 10 nm and an upper-layer high-k film with a thickness of 3 nm to 10 nm. The high-k film may be HfO, or the like. A thickness of the silicon oxide film may be larger than a thickness of the high-k film. A control electrode with a film thickness of 30 nm to 70 nm is formed on the insulating film via a material with a film thickness of 3 nm to 10 nm. The material is a metal oxide film such as TaO, or a metal nitride film such as TaN. Tungsten (W) or the like may be used for the control electrode.

In addition, an air gap may be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first block including a first memory string that includes a first memory cell and a first select transistor;
a second block including a second memory string that includes a second memory cell and a second select transistor;
a source line electrically connected to the first memory string and the second memory string; and
a controller that applies a source line voltage to the source line and a first voltage to a gate of the second select transistor during a program operation in which data is written to the first memory cell, wherein the first voltage is greater than ground voltage, less than or equal to the source line voltage, and different from a second voltage applied to a gate of the first select transistor during the program operation.

2. The device according to claim 1, further comprising:
a well region above which the first and second memory strings are arranged, wherein
the controller applies the first voltage to the well region during the program operation in which data is written to the first memory cell.

3. The device according to claim 1, wherein
the first memory string further includes a third select transistor, and the second memory string further includes a fourth select transistor, and
during the program operation in which data is written to the first memory cell, the controller applies the second voltage which is lower than the first voltage to the gate of the first select transistor, a third voltage which is higher than the first voltage to a gate of the third select transistor, and the second voltage to a gate of the fourth select transistor.

4. The device according to claim 3, wherein the first voltage is equal to the source line voltage and the second voltage is equal to the ground voltage.

5. The device according to claim 1, wherein the first select transistor is between the first memory cell and the source line, and the second select transistor is between the second memory cell and the source line.

6. The device according to claim 1, wherein the first select transistor is between the first memory cell and a bit line for the first memory string, and the second select transistor is between the second memory cell and a bit line for the first memory string.

7. The device according to claim 1, wherein
the controller causes a gate of the second memory cell to enter into an electrically floating state during the program operation in which data is written to the first memory cell.

8. The device according to claim 1, further comprising:
a row decoder having first and second transistors that are commonly controlled by a single block non-select signal.

9. The device according to claim 1, further comprising:
a row decoder having first and second transistors that are respectively controlled by first and second block non-select signals.

10. A semiconductor memory device comprising:
a first block including a first memory string that includes a first memory cell and a first select transistor;
a second block including a second memory string that includes a second memory cell and a second select transistor;
a source line electrically connected to the first memory string and the second memory string; and
a controller that causes a gate of the second select transistor to be in an electrically floating state and applies a voltage to a gate of the first select transistor, during a program operation in which data is written to the first memory cell and while a program voltage is applied to a word line electrically connected to a gate of the first memory cell.

11. The device according to claim 10, further comprising:
a well region above which the first and second memory strings are arranged, wherein
the controller applies a source line voltage to the source line and a first voltage to the well region during the program operation in which data is written to the first memory cell, the first voltage being less than or equal to the source line voltage.

12. The device according to claim 10, wherein the first select transistor is between the first memory cell and the source line, and the second select transistor is between the second memory cell and the source line.

13. The device according to claim 10, wherein the first select transistor is between the first memory cell and a bit line for the first memory string, and the second select transistor is between the second memory cell and a bit line for the first memory string.

14. The device according to claim 10, wherein
the controller causes a gate of the second memory cell to enter into an electrically floating state during the program operation in which data is written to the first memory cell.

15. The device according to claim 10, further comprising:
a row decoder having first and second transistors that are commonly controlled by a single block non-select signal.

16. The device according to claim 10, further comprising:
a row decoder having first and second transistors that are respectively controlled by first and second block non-select signals.

17. A method of carrying out a program operation in a semiconductor memory device comprising a first block including a first memory string that includes a first memory cell and a first select transistor, a second block including a second memory string that includes a second memory cell and a second select transistor, and a source line electrically connected to the first memory string and the second memory string, said method comprising:
during a program operation in which data is written to the first memory cell, applying a source line voltage to the source line, and applying a first voltage to a gate of the second select transistor, wherein
the first voltage is greater than ground voltage, less than or equal to the source line voltage, and different from a second voltage applied to a gate of the first select transistor during the program operation.

18. The method according to claim 17, wherein the semiconductor device further comprises a well region above which the first and second memory strings are arranged, said method further comprising:
during the program operation in which data is written to the first memory cell, applying the second voltage to the well region.

19. The method according to claim 17, wherein the first memory string further includes a third select transistor, and the second memory string further includes a fourth select transistor, said method further comprising:
during the program operation in which data is written to the first memory cell, applying the second voltage which is lower than the first voltage to the gate of the first select transistor, a third voltage which is higher than the first voltage to a gate of the third select transistor, and the second voltage to a gate of the fourth select transistor.

20. The method according to claim 19, wherein the first voltage is equal to the source line voltage and the second voltage is equal to the ground voltage.

* * * * *